(12) United States Patent
Haraguchi

(10) Patent No.: US 12,166,339 B2
(45) Date of Patent: Dec. 10, 2024

(54) CIRCUIT STRUCTURE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 145 days.

(21) Appl. No.: 17/906,458

(22) PCT Filed: Mar. 5, 2021

(86) PCT No.: PCT/JP2021/008744
§ 371 (c)(1),
(2) Date: Sep. 15, 2022

(87) PCT Pub. No.: WO2021/187171
PCT Pub. Date: Sep. 23, 2021

(65) Prior Publication Data
US 2023/0113728 A1    Apr. 13, 2023

(30) Foreign Application Priority Data

Mar. 19, 2020 (JP) ................. 2020-049305

(51) Int. Cl.
*H02G 3/16* (2006.01)
*H05K 1/02* (2006.01)
(Continued)

(52) U.S. Cl.
CPC ................. *H02G 3/16* (2013.01); *H05K 1/14* (2013.01); *H05K 3/44* (2013.01); *H05K 7/06* (2013.01);
(Continued)

(58) Field of Classification Search
CPC ........ H05K 1/14; H05K 1/056; H05K 1/0263; H05K 3/44; H05K 7/06; H05K 7/14329;
(Continued)

(56) References Cited

U.S. PATENT DOCUMENTS

2018/0310410 A1    10/2018  Nakamura et al.
2019/0164878 A1*    5/2019  Hattori ............... H05K 7/14322
(Continued)

FOREIGN PATENT DOCUMENTS

JP    H9-321395 A    12/1997
JP    2013-219290 A    10/2013
(Continued)

OTHER PUBLICATIONS

International Search Report, Application No. PCT/JP2021/008744, mailed May 11, 2021. ISA/Japan Patent Office.

*Primary Examiner* — Hoa C Nguyen
*Assistant Examiner* — Amol H Patel
(74) *Attorney, Agent, or Firm* — Honigman LLP

(57) ABSTRACT

A circuit structure includes a first busbar constituted by a cladding material, a second busbar, an insulating member including an insulating portion located between the first busbar and the second busbar, and an electronic component provided on the first busbar and the second busbar so as to straddle the insulating portion. The electronic component has a connection terminal bonded to the first busbar.

6 Claims, 22 Drawing Sheets

(51) Int. Cl.
   *H05K 1/05*   (2006.01)
   *H05K 1/14*   (2006.01)
   *H05K 3/44*   (2006.01)
   *H05K 7/06*   (2006.01)
   *H05K 7/14*   (2006.01)

(52) U.S. Cl.
   CPC .............. *H05K 2201/10053* (2013.01); *H05K 2201/10166* (2013.01)

(58) Field of Classification Search
   CPC .......... H05K 2201/10053; H05K 2201/10166; H05K 2201/10159; H05K 2201/10969; H05K 2201/10272; H02G 3/16
   See application file for complete search history.

(56) References Cited

U.S. PATENT DOCUMENTS

| | | | |
|---|---|---|---|
| 2019/0189537 A1* | 6/2019 | Fujino | ................... H01L 23/48 |
| 2020/0051911 A1 | 2/2020 | Nakamura et al. | |

FOREIGN PATENT DOCUMENTS

| | | |
|---|---|---|
| JP | 2016-152384 A | 8/2016 |
| JP | 2019-169605 A | 10/2019 |
| JP | 2020-009582 A | 1/2020 |

\* cited by examiner

CIRCUIT STRUCTURE

CROSS-REFERENCE TO RELATED APPLICATIONS

This application is the U.S. national stage of PCT/JP2021/008744 filed on Mar. 5, 2021, which claims priority of Japanese Patent Application No. JP 2020-049305 filed on Mar. 19, 2020, the contents of which are incorporated herein.

TECHNICAL FIELD

The present disclosure relates to a circuit structure.

BACKGROUND ART

JP H9-321395A discloses a heat dissipation board on which electronic components are installed.

An insulating member may be disposed between a plurality of busbars, and an electronic component may be provided on the plurality of busbars so as to straddle the insulation member. Also, connection terminals of the electronic component may be bonded to the busbars. On the other hand, the linear expansion coefficient of the busbars may differ from the linear expansion coefficient of the insulating member such as a resin. When the busbars and the insulating member deform in response to changes in ambient temperature, thermal stress thus occurs in the bonding portions of the connection terminals of the electronic component and the busbars, and cracks could possibly occur in the bonding portions. As a result, the reliability of the bonding portions could possibly decrease. This problem becomes more pronounced in the case of electronic components with a leadless package.

In view of this, an object is to provide a technology capable of improving the reliability of the bonding portion of a connection terminal of an electronic component and a busbar.

SUMMARY

A circuit structure of the present disclosure includes a first busbar constituted by a cladding material, a second busbar, an insulating member including an insulating portion located between the first busbar and the second busbar, and an electronic component provided on the first busbar and the second busbar so as to straddle the insulating portion, the electronic component having a connection terminal bonded to the first busbar.

Advantageous Effects

According to the present disclosure, the reliability of the bonding portion of a connection terminal of an electronic component and a busbar can be improved.

DETAILED DESCRIPTION OF PREFERRED EMBODIMENTS

Figure 1:
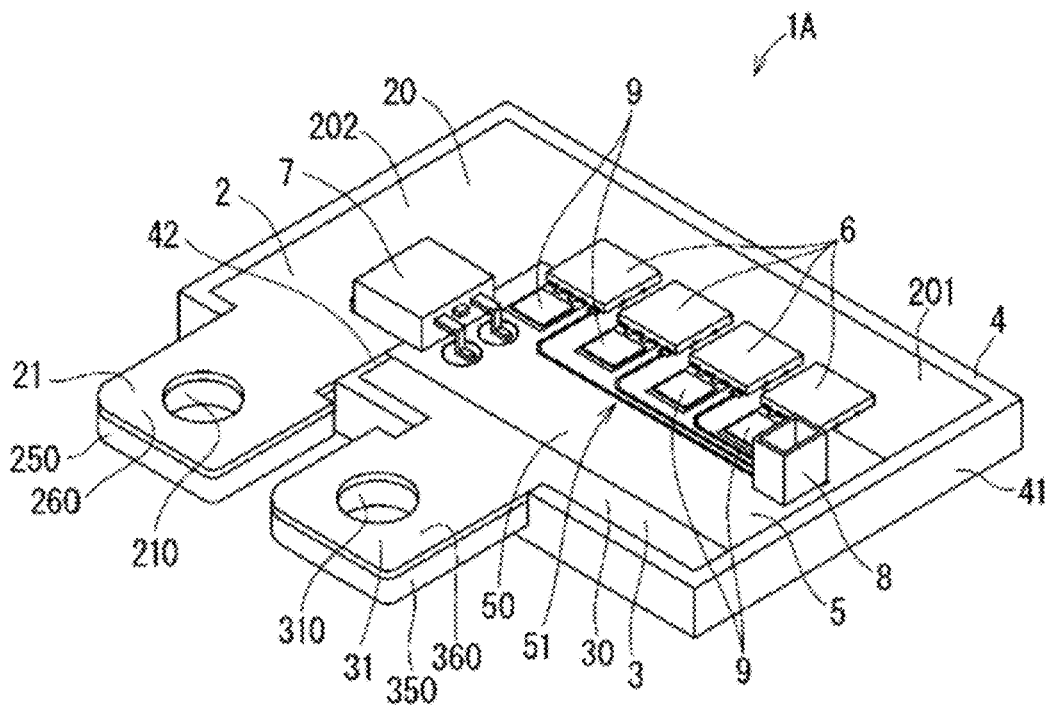
FIG. 1 is a schematic perspective view showing an example of a circuit structure.

Initially, modes of the present disclosure will be enumerated and described.

A circuit structure of the present disclosure is as follows.
First Aspect

In a first aspect, the circuit structure includes a first busbar constituted by a cladding material, a second busbar, an insulating member including an insulating portion located between the first busbar and the second busbar, and an electronic component provided on the first busbar and the second busbar so as to straddle the insulating portion, the electronic component having a connection terminal bonded to the first busbar. According to the present disclosure, given that the first busbar is constituted by a cladding material, a material that bonds easily can be used as the material of the portion of the first busbar to which the connection terminal of the electronic component is bonded. Thus, the connection terminal of the electronic component can be easily bonded to the first busbar. On the other hand, the linear expansion coefficient of a material that bonds easily may differ greatly from the linear expansion coefficient of the insulating member. Even in this case, by selecting a material whose linear expansion coefficient is close to the linear expansion coefficient of the insulating member as the material of other portions constituting the first busbar, the linear expansion coefficient of the first busbar as a whole can be approximated to the linear expansion coefficient of the insulating member. Thermal stress is thereby less likely to occur in the bonding portion of the connection terminal and the first busbar, together with bonding of the connection terminal to the first busbar being facilitated. As a result, the reliability of the bonding portion improves.

Second Aspect

In a second aspect, the first busbar may include a first metal layer and a second metal layer laminated on the first metal layer in a thickness direction of the first busbar, and the connection terminal may be bonded to the second metal layer. In this case, the first busbar constituted by a cladding material can be easily produced by laminating the first metal layer and the second metal layer. Also, in the case where the metal layer that is used as the second metal layer bonds more easily to the connection terminal of the electronic component than does the first metal layer, the linear expansion coefficient of the first busbar as a whole can be approximated to the linear expansion coefficient of the insulating member, while at the same time facilitating bonding of the connection terminal of the electronic component to the second metal layer.

Third Aspect

In the third aspect, the first metal layer may be an aluminum layer, and the second metal layer may be a copper layer or a copper layer whose surface has been metal plated. In this case, the first busbar constituted by a cladding material can be easily produced using aluminum and copper. Also, copper bonds more easily to the connection terminal of the electronic component than aluminum, whereas aluminum has a linear expansion coefficient closer to the insulating member than copper. Accordingly, the linear expansion coefficient of the first busbar as a whole can be approximated to the linear expansion coefficient of the insulating member, while at the same time facilitating bonding of the connection terminal of the electronic component to the second metal layer.

Fourth Aspect

In a fourth aspect, the linear expansion coefficient of the first metal layer may be closer to a linear expansion coefficient of the insulating member than is a linear expansion coefficient of the second metal layer. In this case, a metal layer having a linear expansion coefficient close to the linear expansion coefficient of the insulating member can be employed as the first metal layer, without considering bondability to the connection terminal of the electronic component.

Fifth Aspect

In a fifth aspect, the upper end face of the insulating portion may be flush with an upper surface of the first metal layer or located lower than the upper surface of the first metal layer. In this case, the second metal layer is less likely to be affected by deformation of the insulating portion caused by changes in ambient temperature. As a result, thermal stress is even less likely to occur in the bonding portion of the second metal layer and the connection terminal. Accordingly, a metal layer having a large difference in linear expansion coefficient from the insulating member can be used as the second metal layer.

Sixth Aspect

In a sixth aspect, the first busbar, the second busbar and the insulating member may be molded as one piece. In this case, the circuit structure does not require a member for integrating the first busbar, the second busbar and the insulating member. The configuration of the circuit structure can thereby be simplified.

Seventh Aspect

In a seventh aspect, the second busbar may be constituted by a cladding material. In this case, the linear expansion coefficient of the second busbar as a whole can be approximated to the linear expansion coefficient of the insulating member.

Specific examples of a circuit structure of the present disclosure will be described below with reference to the drawings. Note that the disclosure is not limited to these illustrative examples and is defined by the claims, and all changes that come within the meaning and range of equivalency of the claims are intended to be embraced therein.

Embodiment 1

Outline of Circuit Structure

FIG. 1 is a schematic perspective view showing a circuit structure 1A according to the present embodiment. The circuit structure 1A is incorporated in an electrical junction box 900 (see FIG. 16 below), for example. The electrical junction box 900 is provided on a power supply path between a battery and various electrical components in an automobile, for example.

As shown in FIG. 1, the circuit structure 1A includes an input-side busbar 2 (also simply referred to as busbar 2), an output-side busbar 3 (also simply referred to as busbar 3), and an insulating member 4 for electrically insulating the input-side busbar 2 and the output-side busbar 3. The circuit structure 1A further includes a wiring board 5, a plurality of electronic components 6, an electronic component 7, a connector 8 and a plurality of conductive pieces 9.

The busbars 2 and 3 are conductive members. The electronic components 6 are switching elements, for example. Specifically, the electronic components 6 are MOSFETs (Metal-Oxide-Semiconductor Field-Effect Transistors), for example. A MOSFET is a type of semiconductor switching element. The electronic component 7 is a diode, for example. Specifically, the electronic component 7 is a Zener diode, for example. Hereafter, the electronic components 6 may be referred to as MOSFETs 6. The electronic component 7 may be referred to as Zener diode 7. The electronic components 6 may be switching elements other than MOSFETs. Also, the electronic components 6 may be electronic components other than switching elements. The electronic component 7 may be a diode other than a Zener diode. Also, the electronic component 7 may be an electronic component other than a diode.

The drain terminals of the plurality of MOSFETs 6 are electrically connected to each other, for example. Also, the source terminals of the plurality of MOSFETs 6 are electrically connected to each other, for example. The Zener diode 7 is an electronic component for preventing an overvoltage from being applied between the drain terminal and the source terminals of each MOSFET 6. A cathode terminal of the Zener diode 7 is electrically connected to the drain terminals of the plurality of MOSFETs 6, for example. An anode terminal of the Zener diode 7 is electrically connected to the source terminals of the plurality of MOSFETs 6, for example. The drain terminal of each MOSFET 6 is electrically connected to the input-side busbar 2. The source terminals of each MOSFET 6 is electrically connected to the output-side busbar 3. The drain terminals, source terminals and gate terminals of the MOSFET 6 can also be said to be connection terminals. Similarly, the cathode terminal and anode terminal of the Zener diode 7 can also be said to be connection terminals. In the present example, the circuit structure 1A includes four MOSFETs 6, but the number of MOSFETs 6 included in the circuit structure 1A is not limited thereto.

The busbar 2 is a plate-shaped metal member, for example. The busbar 2 includes a main body part 20 and an input terminal part 21 protruding from the main body part 20, for example. The main body part 20 and the input terminal part 21 are located in the same plane. The main body part 20 is a plate-shaped portion that is substantially L-shaped, for example. The main body part 20 includes a first portion 201 and a second portion 202 forming an L-shape with the first portion 201. The first portion 201 and the second portion 202 are rectangular plate-shaped portions, for example. The drain terminal of each MOSFET 6 is electrically connected to the first portion 201. The cathode terminal of the Zener diode 7 is electrically connected to the second portion 202. The input terminal part 21 is a plate-shaped portion and protrudes from one longitudinal end of the second portion 202. The input terminal part 21 has an open hole 210 that passes through in the thickness direction thereof. A wiring member extending from the battery is connected to the input terminal part 21 by utilizing the open hole 210, for example. A bolt is, for example, passed through an open hole in a connection terminal included in the wiring member and the open hole 210 of the input terminal part 21, and a nut is then attached to the bolt, thus bolting the connection terminal of the wiring member to the input terminal part 21. The output voltage of the battery is applied to the input terminal part 21 through the wiring member. The output voltage of the battery applied to the input terminal part 21 is applied to the drain terminals of the MOSFETs 6 through the main body part 20.

The busbar 3 is a plate-shaped metal member, for example. The busbars 2 and 3 are located in the same plane. The busbar 3 includes a main body part 30 and an output terminal part 31 protruding from the main body part 30. The main body part 30 and the output terminal part 31 are located in the same plane. The main body part 30 is a rectangular plate-shaped portion, for example. The wiring board 5 is provided on the main body part 30. The main body part 30 is located in the same plane as the main body part 20, so as to be adjacent to the first portion 201 and the second portion 202 of the main body part 20. The long direction of the main body part 30 is parallel to the long direction of the first portion 201. The source terminals of each MOSFET 6 and the anode terminal of the Zener diode 7 are electrically connected to the main body part 30.

The output terminal part 31 is a plate-shaped portion and protrudes from one end in the short direction of the main body part 30. The output terminal part 31 is located in the same plane as the input terminal part 21 so as to be adjacent thereto. The output terminal part 31 has an open hole 310 that passes through in the thickness direction thereof. A wiring member extending from an electrical component is connected to the output terminal part 31 by utilizing the open hole 310, for example, similarly to the input terminal part 21. The voltage that is output by the source terminals of the MOSFETs 6 is applied to the output terminal part 31. The voltage applied to the output terminal part 31 is applied as a power supply to the electrical component through the wiring member, for example.

The insulating member 4 holds the busbars 2 and 3, while at the same time electrically insulating the busbars 2 and 3. The insulating member 4 is constituted by an insulating resin, for example. Specifically, the insulating member 4 is constituted by PPS (Polyphenylene Sulfide) resin, for example. The insulating member 4 is molded as one piece with the busbars 2 and 3, for example. The insulating member 4 is molded as one piece with the busbars 2 and 3 by insert molding, for example. The insulating member 4 includes a frame-shaped insulating portion 41 and an L-shaped insulating portion 42 that is joined to the insulating portion 41. The frame-shaped insulating portion 41 is attached to the main body parts 20 and 30 so as to surround the main body parts 20 and 30. The L-shaped insulating portion 42 is located between the L-shaped main body part 20 and the main body part 30. The insulating portion 42 is located between the first portion 201 of the main body part 20 and the main body part 30, and is also located between the second portion 202 of the main body part 20 and the main body part 30. The busbars 2 and 3 are electrically insulated by the insulating portion 42.

The wiring board 5 is a rectangular plate-shaped member, for example. The wiring board 5 is provided on the main body part 30 of the busbar 3. The wiring board 5 has an insulating board 50 and a conductive layer 51 provided on the insulating board 50, for example. The insulating board 50 may be a ceramic board or a board containing resin, for example. In the latter case, the insulating board 50 may be a glass epoxy board or may be another board containing resin. The thickness of the insulating board 50 may be set from 0.4 mm to 0.6 mm inclusive, for example. The conductive layer 51 may be constituted by copper or may be constituted by another metal. The conductive layer 51 is provided on the upper surface of the insulating board 50, for example. The wiring board 5 has the conductive layer 51 on the upper surface thereof. The wiring board 5 may be a single-layer board or a multi-layer board. The wiring board 5 may have a conductive layer on the lower surface or as an inner layer, in addition to the upper surface. The gate terminal of each MOSFET 6 is electrically connected to the conductive layer 51 of the wiring board 5. In the present example, the wiring board 5 is a rigid board, but may be a sheet-like flexible board or a composite board in which a rigid board and a flexible board are formed as one piece.

The connector 8 is provided on the upper surface of the wiring board 5. The gate terminals of the plurality of MOSFETs 6 are electrically connected to the connector 8 through the conductive layer 51 of the wiring board 5. Switching control of the MOSFETs 6 is performed externally through the connector 8.

The plurality of conductive pieces 9 are provided in correspondence with the plurality of MOSFETs 6. The conductive pieces 9 are each provided in order to reduce electrical resistance between the source terminals of the MOSFET 6 corresponding thereto and the busbar 3. The conductive pieces 9 may be constituted by copper or another metal, for example. In the former case, the conductive pieces 9 may be constituted by oxygen-free copper, for example. Oxygen-free copper C1020 specified in Japanese Industrial Standards (JIS), for example, is employed as this oxygen-free copper. The conductive pieces 9 may also be constituted by a copper alloy.

Detailed Description of Circuit Structure

Figure 2:
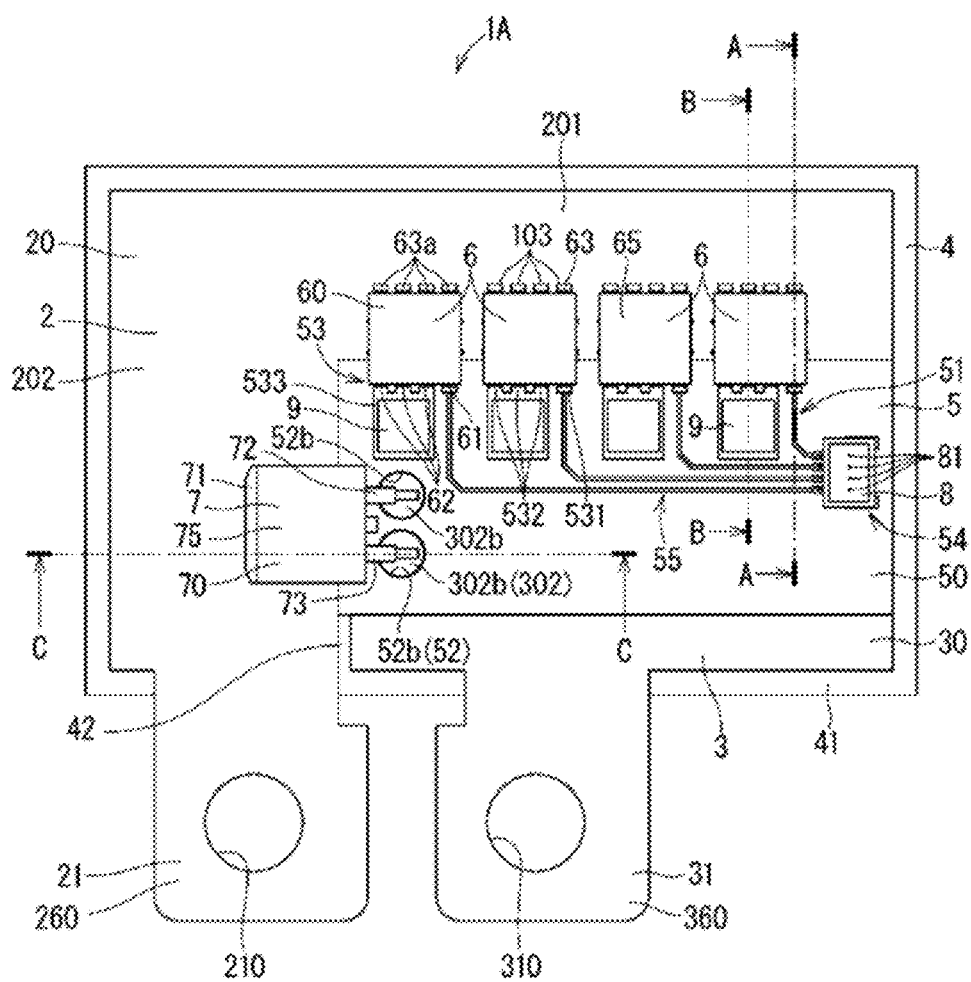
FIG. 2 is a schematic plan view showing an example of the circuit structure.
Figure 3:
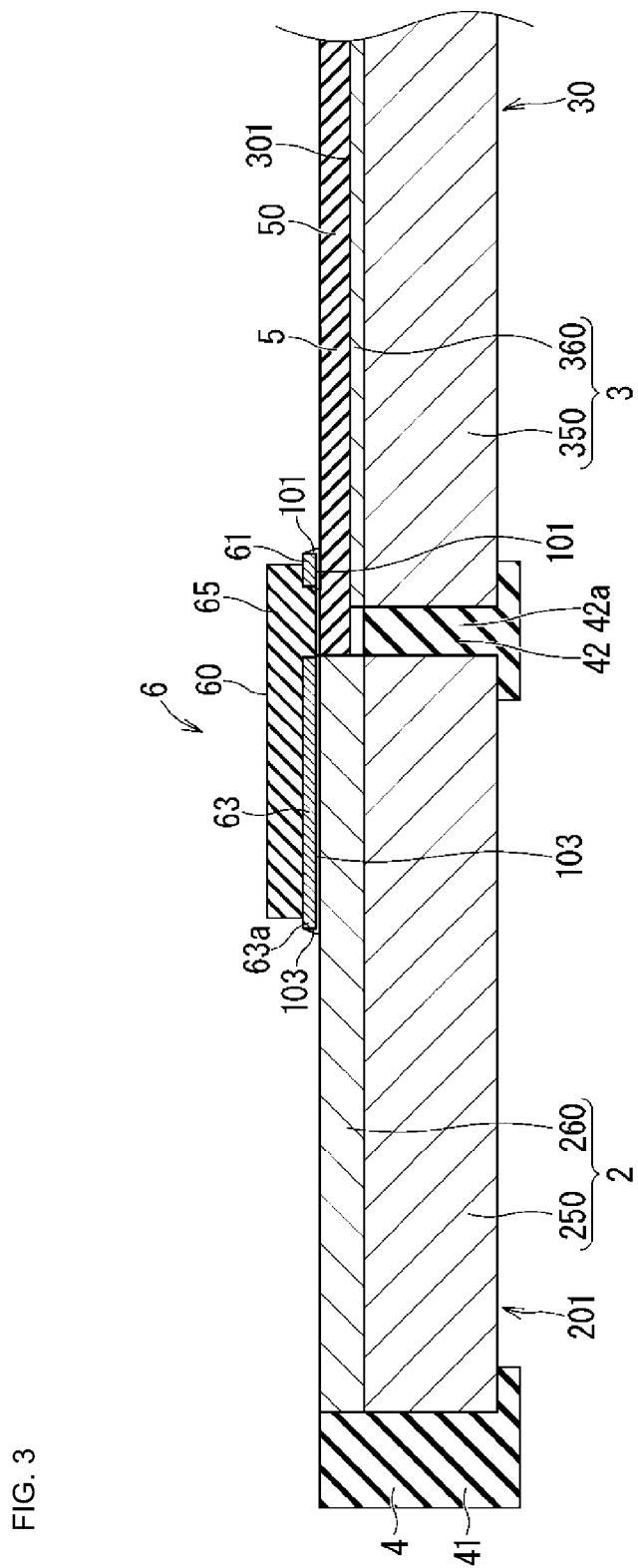
FIG. 3 is a schematic view showing an example of the cross-sectional structure of the circuit structure.
Figure 4:
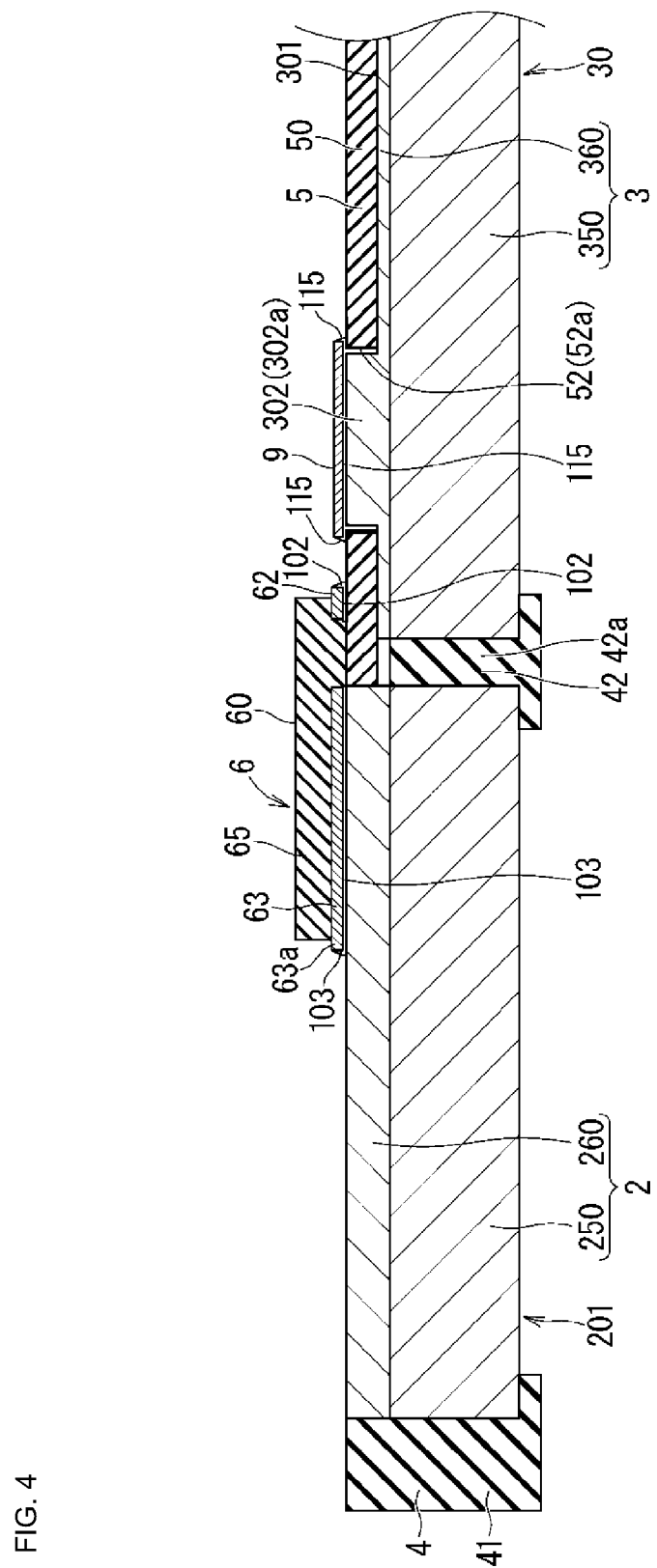
FIG. 4 is a schematic view showing an example of the cross-sectional structure of the circuit structure.
Figure 5:
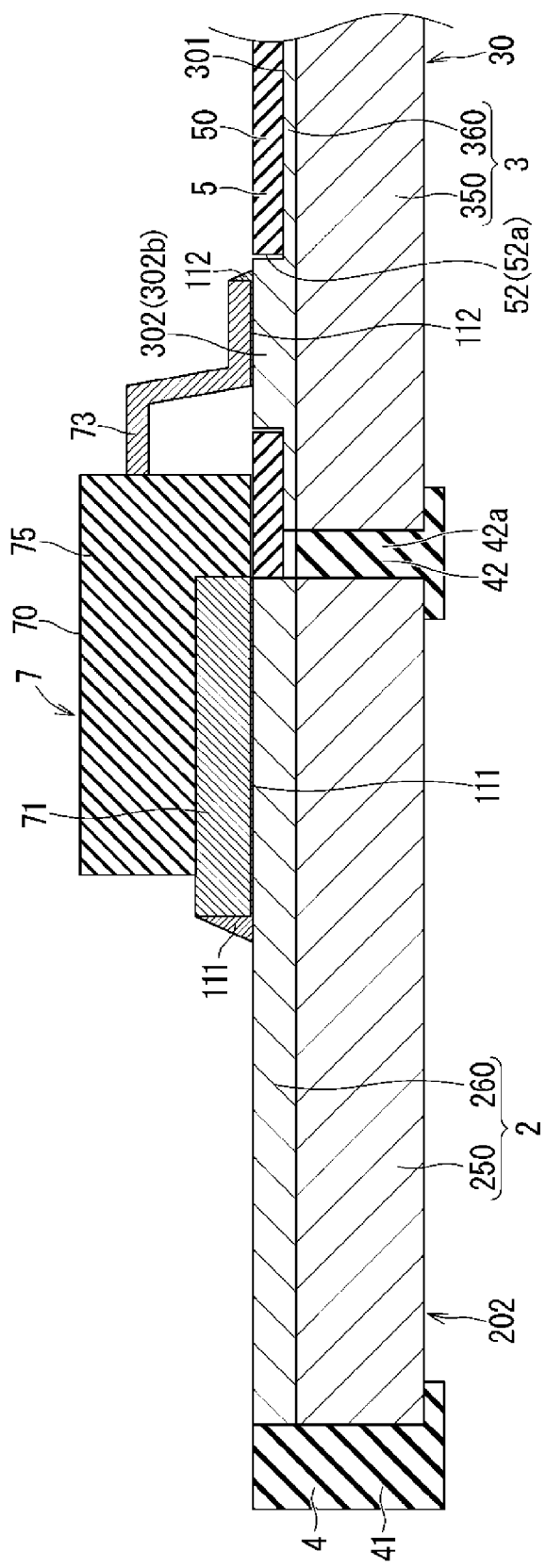
FIG. 5 is a schematic view showing an example of the cross-sectional structure of the circuit structure.
Figure 6:
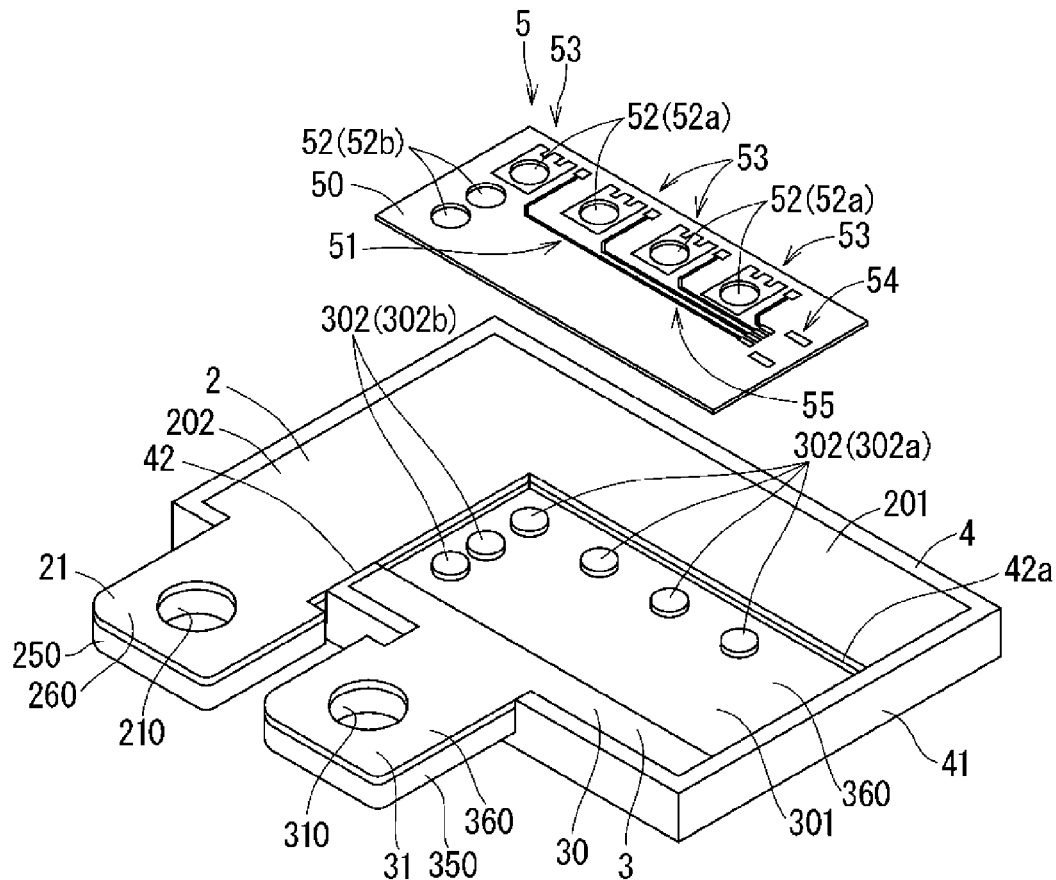
FIG. 6 is a schematic perspective view showing an example of the configuration of part of the circuit structure.

FIG. 2 is a schematic plan view showing the circuit structure 1A. FIG. 3 is a schematic view showing the cross-sectional structure taken along a line indicated by arrows A-A shown in FIG. 2. FIG. 4 is a schematic view showing the cross-sectional structure taken along a line indicated by arrows B-B shown in FIG. 2. FIG. 5 is a schematic view showing the cross-sectional structure taken along a line indicated by arrows C-C shown in FIG. 2. FIG. 6 is a schematic perspective view showing an example of the busbar 2, the busbar 3, the insulating member 4 and the wiring board 5 that are included in the circuit structure 1A. In FIG. 6, the wiring board 5 separated from the busbar 3 is shown.

Example Configuration of Busbar

The busbar 2 is constituted by a cladding material, for example. The cladding material is also called clad metal. In the present example, the busbar 2 is constituted by two layers, for example. As shown in FIGS. 3 to 5, the busbar 2 includes a metal layer 250 on the lower surface side (also referred to as lower metal layer 250) and a metal layer 260 on the upper surface side (also referred to as upper metal layer 260). The metal layers 250 and 260 are laminated in the thickness direction of the busbar 2. The metal layers 250 and 260 are bonded to each other by a method such as assembly rolling, cast rolling, explosive crimping, overlay welding or diffusion welding, for example. The interface between the metal layer 250 and the metal layer 260 is formed by diffusion bonding, for example.

The busbar 2 is constituted by a copper and aluminum cladding material, for example. In the present example, the lower metal layer 250 is an aluminum layer, for example, and the upper metal layer 260 is a copper layer, for example. The lower metal layer 250 is constituted by pure aluminum, for example. Pure aluminum A1050 specified in JIS, for example, is employed as this pure aluminum. The upper metal layer 260 is constituted by oxygen-free copper, for example. Oxygen-free copper C1020 specified in JIS, for example, is employed as this oxygen-free copper.

The linear expansion coefficient of the metal layer 250 is closer to the linear expansion coefficient of the insulating member 4 than is the linear expansion coefficient of the metal layer 260, for example. In the present example, the linear expansion coefficient of the insulating member 4 constituted by PPS is 40 ppm/° C., for example. The linear expansion coefficient of the metal layer 250 constituted by pure aluminum is 24 ppm/° C., for example. The linear expansion coefficient of the metal layer 260 constituted by oxygen-free copper is 17 ppm/° C., for example. The linear expansion coefficient may be referred to as the thermal expansion coefficient. Also, the conductivity of the upper metal layer 260 is greater than the conductivity of the lower metal layer 250.

The upper surface and lower surface of the busbar 2 are both flat, for example. That is, the upper surface of the upper metal layer 260 and the lower surface of the lower metal layer 250 are both flat, for example. The thickness of the metal layer 250 is set to be greater than the thickness of the metal layer 260, for example. The thickness of the metal layer 250 may, for example, be set to 3 mm, and the thickness of the metal layer 260 may be set to 2 mm.

The busbar 3, similarly to the busbar 2, is constituted by a cladding material, for example. In the present example, the busbar 3 is constituted by two layers, for example. As shown in FIGS. 3 to 5, the busbar 3 includes a metal layer 350 on the lower surface side (also referred to as lower metal layer 350) and a metal layer 360 on the upper surface side (also referred to as upper metal layer 360). The metal layers 350 and 360 are bonded to each other by a method such as assembly rolling, cast rolling, explosive crimping, overlay welding or diffusion welding, for example. The interface between the metal layer 350 and the metal layer 360 is formed by diffusion bonding, for example.

The busbar 3 is constituted by a copper and aluminum cladding material, for example. In the present example, the lower metal layer 350 is an aluminum layer, for example, and the upper metal layer 360 is a copper layer, for example. The lower metal layer 350 is constituted by pure aluminum, for example. Pure aluminum A1050 specified in JIS, for example, is employed as this pure aluminum. The upper metal layer 360 is constituted by oxygen-free copper, for example. Oxygen-free copper C1020 specified in JIS, for example, is employed as this oxygen-free copper.

The linear expansion coefficient of the metal layer 350 is closer to the linear expansion coefficient of the insulating member 4 than is the linear expansion coefficient of the metal layer 360, for example. In the present example, the linear expansion coefficient of the metal layer 350 constituted by pure aluminum is 24 ppm/° C., for example. The linear expansion coefficient of the metal layer 360 constituted by oxygen-free copper is 17 ppm/° C., for example. Also, the conductivity of the upper metal layer 360 is greater than the conductivity of the lower metal layer 350.

The lower surface of the busbar 3 is flat, for example. That is, the lower surface of the lower metal layer 350 is flat, for example. The lower surface of the busbar 3 is located in the same plane as the lower surface of the busbar 2, for example. On the other hand, the upper surface of the busbar 3 has a region 301 that is one step lower than the other regions, as shown in FIG. 6. This region 301 is a board mounting region 301 on which the wiring board 5 is mounted. Part of the upper surface of the main body part 30, for example, constitutes the board mounting region 301.

In the present example, the upper surface of the upper metal layer 360 is partially lower, and this lower region constitutes the board mounting region 301. That is, the board mounting region 301 is provided on the upper surface of the upper metal layer 360. The board mounting region 301 is lower than the upper surface of the busbar 2, for example. On the upper surface of the busbar 3, regions other than the board mounting region 301 are located in the same plane as the upper surface of the busbar 2, for example.

A plurality of conductive raised parts 302 are provided in the board mounting region 301. The plurality of raised parts 302 are constituted by part of the busbar 3, for example. Specifically, the plurality of raised parts 302 are constituted by part of the metal layer 360, for example. The raised parts 302 can be said to be molded as one piece with the busbar 3. Also, the raised parts 302 can be said to be molded as one piece with the metal layer 360. In the present example, the raised parts 302 are part of the metal layer 360, and are thus constituted by copper, for example.

The raised parts 302 are disk-shaped, for example. When the wiring board 5 is mounted in the board mounting region 301, the plurality of protruding units 302 are inserted into a plurality of open holes 52, described later, provided in the wiring board 5.

The plurality of raised parts 302 include four raised parts 302a respectively corresponding to the four MOSFETs 6. Also, the plurality of raised parts 302 includes two raised parts 302b corresponding to the Zener diode 7. The plurality of raised parts 302a are aligned in the long direction of the main body part 30. Of the two edge portions of the main body part 30 in the short direction thereof, the plurality of raised parts 302a are provided at the edge portion close to the first portion 201 of the busbar 2. The plurality of raised parts 302a are aligned along the first portion 201 of the busbar 2. The two raised parts 302b are aligned in the short direction of the main body part 30. Of the two edge portions of the main body part 30 in the long direction thereof, the two raised parts 302b are provided at the edge portion close to the second portion 202 of the busbar 2. Of the plurality of raised parts 302a, the raised part 302a closest to the second portion 202 is aligned with the two raised parts 302b in the short direction of the main body part 30. The roles of the raised parts 302a and 302b will be described in detail later.

The thickness of the metal layer 350 is set to be greater than the thickness of the metal layer 360, for example. The thickness of the metal layer 350 may, for example, be set to 3 mm. Also, the thickness of the portion of the metal layer 360 where the board mounting region 301 is not provided on the upper surface may be set to 2 mm.

Example Configuration of MOSFET

Figure 7:
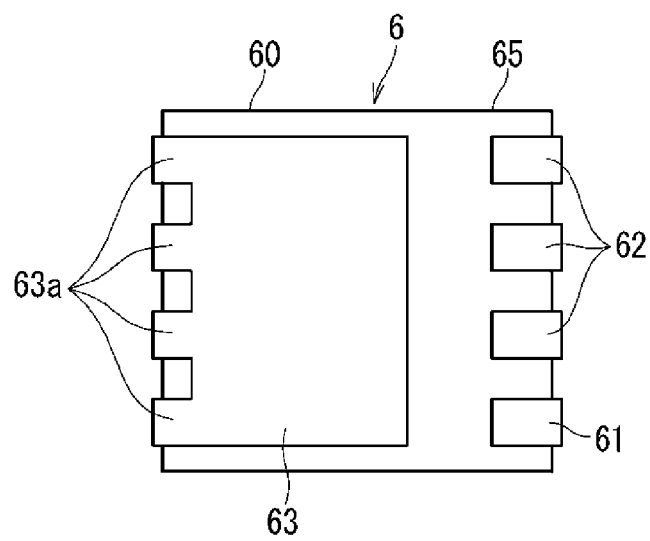
FIG. 7 is a schematic plan view showing an example of an electronic component.

FIG. 7 is a schematic plan view showing an example of the back surface of the MOSFET 6. Here, for convenience of description, the configuration of the MOSFET 6 will be described, with the right side and the left side in FIG. 7 respectively being the right side and the left side of the MOSFET 6, and the up-down direction in FIG. 7 being the up-down direction of the MOSFET 6.

The MOSFET 6 is a surface mount component, for example. As shown in FIG. 7, the MOSFET 6 includes a package 60 in which a semiconductor device and the like are housed. The package 60 is a leadless package, for example. The package 60 includes a main body part 65, a gate terminal 61, a plurality of source terminals 62 and a drain terminal 63. The gate terminal 61, the plurality of source terminals 62 and the drain terminal 63 are provided on the back surface of the main body part 65.

The main body part 65 is constituted by a resin such as an epoxy resin, for example. The plurality of source terminals 62 are electrically connected to each other inside the main body part 65. The gate terminal 61, the source terminals 62 and the drain terminal 63 are constituted by a metal, for example. The gate terminal 61, the source terminals 62 and the drain terminal 63 may be constituted by oxygen-free copper, for example. Oxygen-free copper C1020 specified in JIS, for example, is employed as this oxygen-free copper. The gate terminal 61, the source terminals 62 and the drain terminal 63 may also be constituted by a copper alloy. The gate terminal 61, the source terminals 62 and the drain terminal 63 have a flat plate shape, for example.

On the right edge portion of the back surface of the main body part 65, the gate terminal 61 and the plurality of source terminals 62 are aligned in a row in the up-down direction. The gate terminal 61 and the plurality of source terminals 62 protrude slightly outward from the right edge of the back surface of the main body part 65. The left edge of the drain terminal 63 is uneven, and a plurality of protruding parts 63a aligned in the up-down direction are provided on the left edge. The plurality of protruding parts 63a protrude slightly outward from the left edge of the back surface of the main body part 65.

Note that the shape of the package 60 is not limited to the above example. The shape of the drain terminal 63 may, for example, be other than the shape in FIG. 7. Also, the number of source terminals 62 that are included in the package 60 may be other than three. The package 60 may be a leaded package.

Example Configuration of Zener Diode

The configuration of the Zener diode 7 will be described with reference to FIGS. 2 and 5. Here, for convenience of description, the configuration of the Zener diode 7 will be described, with the left side and the right side in FIG. 2 respectively being the upper side and lower side of the Zener diode 7, and the up-down direction of FIG. 2 being the left-right direction of the Zener diode 7.

As shown in FIGS. 2 and 5, the Zener diode 7 includes a package 70 in which a semiconductor device and the like are housed. The package 70 is a leaded package, for example. The package 70 includes a main body part 75, a cathode terminal 71 and anode terminals 72 and 73.

The main body part 75 is constituted by a resin such as an epoxy resin, for example. The cathode terminal 71 and the anode terminals 72 and 73 are constituted by a metal, for example. The cathode terminal 71 and the anode terminals 72 and 73 may be constituted by oxygen-free copper, for example. Oxygen-free copper C1020 specified in JIS, for example, is employed as this oxygen-free copper. The cathode terminal 71 and the anode terminals 72 and 73 may also be constituted by a copper alloy. The cathode terminal 71 has a flat plate shape, for example. The anode terminals 72 and 73 are lead terminals, and have a shape in which an elongated plate-shaped portion is bent in two places, for example.

The cathode terminal 71 is provided on the back surface of the main body part 75. The upper edge portion of the cathode terminal 71 protrudes slightly from the upper edge of the back surface of the main body part 75. The anode terminals 72 and 73 extend outward from the lower end face of the main body part 75 and are adjacently arranged in the left-right direction. The distal end portions of the anode terminals 72 and 73 are disposed on the wiring board 5.

Note that the shape of the package 70 is not limited to the above example. The shape of at least one of the cathode terminal 71 and the anode terminals 72 and 73 may, for example, be other than the shape in FIGS. 2 and 5. Also, the package 70 may be a leadless package.

Example Configuration of Wiring Board

Figure 8:
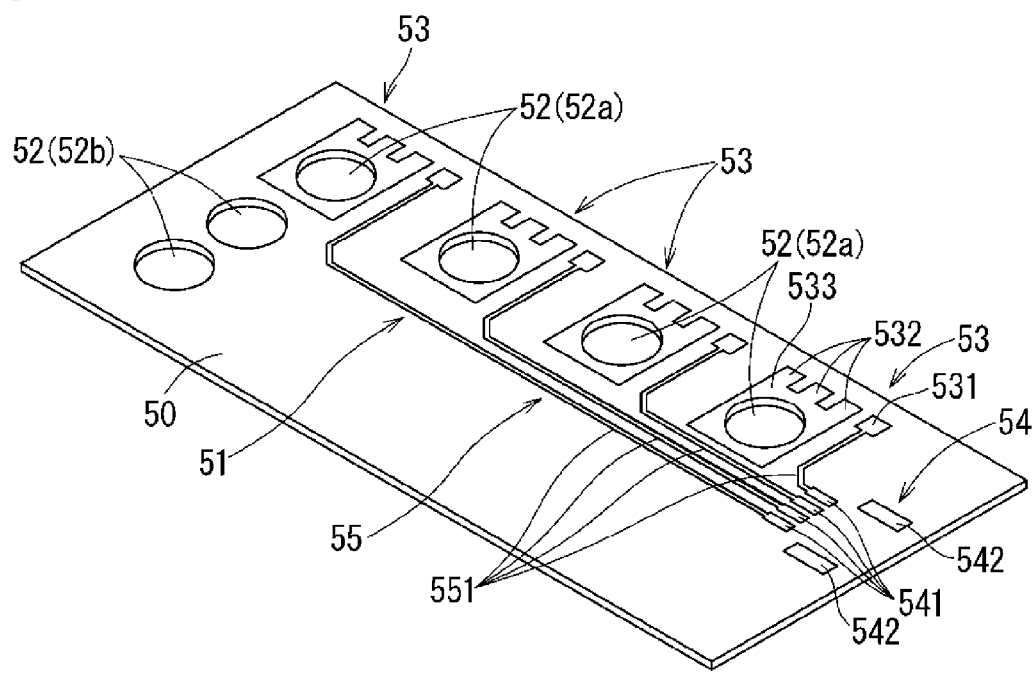
FIG. 8 is a schematic perspective view showing an example of a wiring board.

FIG. 8 is a schematic perspective view showing an example of the wiring board 5. As shown in FIGS. 6, 8 and other diagrams, the wiring board 5 includes the plurality of open holes 52 that pass through in the thickness direction thereof. The plurality of open holes 52 include four open holes 52a respectively corresponding to the four MOSFETs 6 and two open holes 52b corresponding to the Zener diode 7, for example. The four open holes 52a are provided at one edge portion of the wiring board 5 in the short direction thereof so as to be aligned in the long direction of the wiring board 5. The two open holes 52b are provided at one edge portion of the wiring board 5 in the long direction thereof so as to be aligned in the short direction of the wiring board 5. Of the plurality of open holes 52a, the open hole 52a closest to the one end is aligned with the two open holes 52b in the short direction of the wiring board 5. The MOSFETs 6 are respectively disposed close to the open holes 52a corresponding thereto. The Zener diode 7 is disposed close to the two open holes 52b.

The conductive layer 51 of the wiring board 5 includes a plurality of conductive regions 53 respectively corresponding to the plurality of MOSFETs 6, as shown in FIGS. 6, 8 and other diagrams. Also, the conductive layer 51 includes a conductive region 54 corresponding to the connector 8 and a wiring region 55. Note that, in FIGS. 3 to 5, illustration of the conductive layer 51 is omitted.

The conductive regions 53 each have a land 531 to which the gate terminal 61 of the corresponding MOSFET 6 is bonded. The conductive regions 53 each have three lands 532 to which the three source terminals 62 of the corresponding MOSFET 6 are respectively bonded. Lands to which a terminal or the like is bonded are also called pads.

Each conductive region 53 has an extension region 533 extending from the plurality of lands 532. The extension region 533 included in the conductive region 53 corresponding to each MOSFET 6 is located around the open hole 52a corresponding to the MOSFET 6. The extension region 533 is provided so as to surround the opening edge of the open hole 52a (specifically, the opening edge on the upper surface side of the wiring board 5). The open hole 52a can also be said to be provided in the extension region 533. The lands 532 can also be said to be protruding parts protruding from the extension region 533.

In the present example, the open holes 52a are through holes in which a conductive region is formed on the inner circumferential surface thereof, for example. On the other hand, the open holes 52b do not have a conductive region formed on the inner circumferential surface thereof and are not through holes, for example. The conductive region on the inner circumferential surface of the open holes 52a is constituted by a metal, for example. The conductive region on the inner circumferential surface of the open holes 52a may be constituted by the same material as the conductive layer 51 or may be constituted by a different material. The conductive region on the inner circumferential surface of each open hole 52a is joined to the extension region 533 around the open hole 52a. Note that a conductive region may not be formed on the inner circumferential surface of the open holes 52a. Also, the open holes 52b may be through holes in which a conductive region is formed on the inner circumferential surface thereof.

The conductive region 54 corresponding to the connector 8 includes four lands 541 and two lands 542, for example. The two lands 542 are lands for fixing the connector 8 to the wiring board 5. Two metal regions for use in fixing the connector 8 are provided on the back surface of the connector 8. The two metal regions are respectively bonded by solder to the two lands 542, for example. A main component of the solder is tin. Also, the connector 8 includes four connection terminals 81 respectively electrically connected to the gate terminals 61 of the plurality of MOSFETs 6 (see FIG. 2). The connection terminals 81 are constituted by a metal, for example. The plurality of connection terminals 81 of the connector 8 are respectively bonded to the plurality of lands 541 by solder, for example.

The wiring region 55 includes four wirings 551 that are respectively electrically connected to the gate terminals 61 of the four MOSFETs 6, for example. The plurality of wirings 551 are respectively joined at one end to the plurality of lands 531 to which the gate terminals 61 of the plurality of MOSFETs 6 are bonded. The plurality of wirings 551 are respectively joined at the other end to the plurality of lands 541 to which the plurality of connection terminals 81 of the connector 8 are bonded. The gate terminals 61 are respectively electrically connected to the connection terminals 81 of the connector 8 through the wirings 551.

Figure 9:
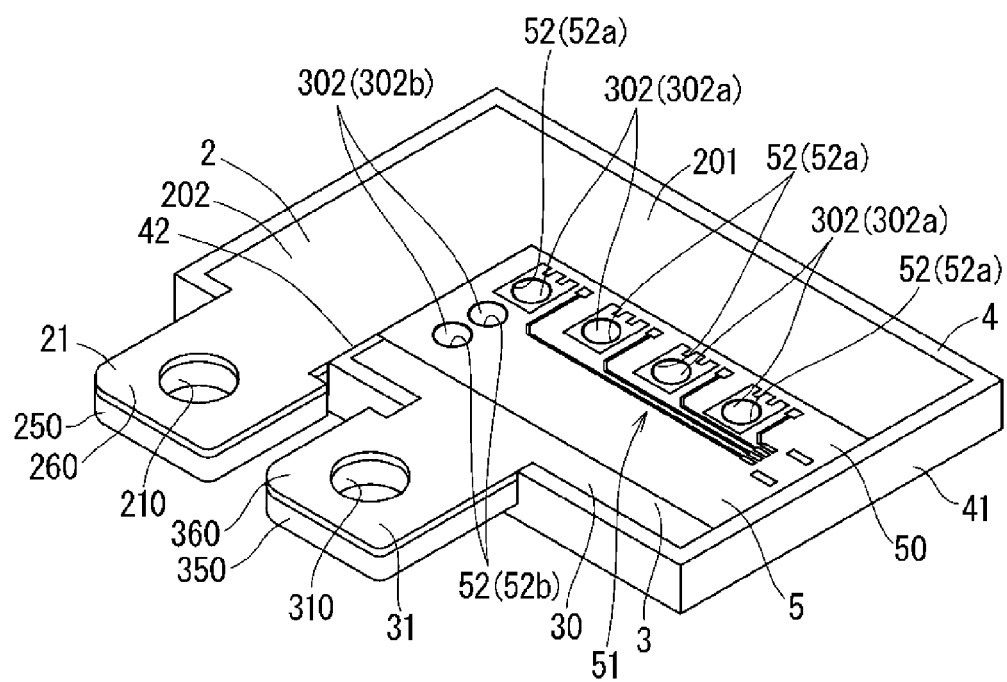
FIG. 9 is a schematic perspective view showing an example of the configuration of part of the circuit structure.

The wiring board 5 having a configuration such as the above is mounted on the board mounting region 301 on the upper surface of the busbar 3. The outer shape of the board mounting region 301 has substantially the same shape as the outer shape of the wiring board 5. FIG. 9 is a diagram showing an example of the wiring board 5 mounted on the board mounting region 301 of the busbar 3.

When the wiring board 5 is mounted on the board mounting region 301, the plurality of raised parts 302a of the busbar 3 are respectively inserted into the plurality of open holes 52a of the wiring board 5, and also the plurality of raised parts 302b of the busbar 3 are inserted into the plurality of open holes 52b of the wiring board 5. In a state where the wiring board 5 is mounted on the board mounting region 301, the raised parts 302a protrudes from the busbar 3 into the open holes 52a, and the raised parts 302b protrude from the busbar 3 into the open holes 52b. The diameter of the raised parts 302 is set slightly smaller than the diameter of the open holes 52. The raised parts 302 can also be said to fit into the open holes 52.

The wiring board 5 on the board mounting region 301 is located not only on the busbar 3 but also on the L-shaped insulation portion 42 located between the busbar 2 and the busbar 3. In the insulating portions 42, the upper end face of a surrounding portion 42a (see FIG. 6) located around the board mounting region 301 is flush with the upper surfaces of the lower metal layers 250 and 350, for example, as shown in FIGS. 4 and 5. The surrounding portion 42a is not located between the upper metal layer 260 and the upper metal layer 360. The wiring board 5 is located on the board mounting region 301 and is also located above the surrounding portion 42a located around the board mounting region 301 with a gap from the upper end face of the surrounding portion 42a. An insulating member such as adhesive tape may be provided in the gap, for example. The wiring board 5 is adjacent to the first portion 201 and the second portion 202 of the busbar 2. The upper surface of the insulating board 50 of the wiring board 5 mounted in the board mounting region 301 is flush with the upper surface of the busbar 2 and with the region of the upper surface of the busbar 3 other than the board mounting region 301. Note that the upper surface of the conductive layer 51 on the insulating board 50 may be located in the same plane as the upper surface of the busbar 2 and the region of the upper surface of the busbar 3 other than the board mounting region 301.

The wiring board 5 is fixed to the board mounting region 301 by a bonding material, for example. Double-sided adhesive tape, for example, is employed as the bonding material. Other members may also be employed as the bonding material. Also, the wiring board 5 may be simply placed in the board mounting region 301 and not fixed.

The upper surfaces of the raised parts 302 in the open holes 52 are located in the same plane as the upper surface of the conductive layer 51 on the insulating board 50 of the wiring board 5, for example. In this case, the upper surface of the raised part 302a in each open hole 52a will be flush with the upper surface of the extension region 533 around the open hole 52a. Note that the upper surfaces of the raised parts 302 may be located in the same plane as the upper surface of the insulating board 50.

Regarding Conductive Pieces

The plurality of conductive pieces 9 are respectively bonded to the plurality of raised parts 302a exposed from the upper surface of the wiring board 5. Also, the plurality of conductive pieces 9 are respectively bonded to the plurality of extension regions 533 of the wiring board 5. Each conductive piece 9 is provided on the wiring board 5 so as to cover the upper surface of the raised part 302a in the open hole 52a of the wiring board 5 and a peripheral portion of the open hole 52a. The conductive piece 9 covers the opening edge of the open hole 52a (specifically, the opening edge on the upper surface side of the wiring board 5). The thickness of the conductive pieces 9 may be set from 0.2 mm to 0.5 mm inclusive, for example.

Each conductive piece 9 is bonded by a conductive bonding material 115 to the upper surface of the raised part 302a in the open hole 52a and to the extension region 533 around the open hole 52a (see FIG. 4). Solder, for example, is employed as the conductive bonding material 115. The conductive bonding material 115 bonds the back surface of the conductive piece 9 to the upper surface of the raised part 302a and the extension region 533, and bonds the end faces of the conductive piece 9 to the upper surface of the extension region 533. The conductive bonding material 115 includes a portion located between the conductive piece 9 and the raised part 302a and extension region 533.

Note that the conductive bonding material 115 may enter the open holes 52a. In this case, the conductive region on the inner circumferential surface of each open hole 52a which is a through hole and the raised part 302a in the open hole 52a may be bonded by the conductive bonding material 115.

Example Implementation of Electronic Components

The MOSFETs 6 are mounted to straddle between both the busbar 2 and the wiring board 5 that is on the busbar 3. The MOSFETs 6 are, for example, mounted to straddle between the first portion 201 of the busbar 2 and the edge portion on which the conductive regions 53 are formed in the short direction of the wiring board 5. In other words, the MOSFETs 6 are mounted to straddle between the first portion 201 of the busbar 2 and the portion of the wiring board 5 adjacent to the first portion 201. As shown in FIG. 6, the insulating portion 42 (more specifically, the surrounding portion 42a) is located between the first portion 201 of the busbar 2 and the busbar 3. The MOSFETs 6 are provided on the busbars 2 and 3 so as to straddle the insulating portion 42.

The drain terminals 63 of the MOSFETs 6 are bonded by a conductive bonding material 103 (see FIGS. 2 to 4) to the upper surface of the first portion 201 of the busbar 2. Solder, for example, is employed as the conductive bonding material 103. The conductive bonding material 103 bonds the back surfaces and end faces of the drain terminals 63 to the first portion 201. The conductive bonding material 103 includes a portion located between the drain terminals 63 and the first portion 201. The voltage that is applied to the input terminal part 21 of the busbar 2 is applied to the drain terminals 63 bonded to the busbar 2.

The gate terminal 61 of each MOSFET 6 is bonded by a conductive bonding material 101 (see FIG. 3) to the land 531 of the conductive region 53 corresponding to the MOSFET 6. Solder, for example, is employed as the conductive bonding material 101. The conductive bonding material 101 bonds the back surface and end face of the gate terminal 61 and the land 531, for example. The conductive bonding material 101 includes a portion located between the gate terminal 61 and the land 531. The gate terminal 61 is electrically connected to the connection terminal 81 of the connector 8 through the land 531, the wiring 551 joined to the land 531, and the land 541 joined to the wiring 551. Switching control of each MOSFET 6 is performed externally through the connector 8.

The plurality of source terminals 62 of each MOSFET 6 are respectively bonded by a conductive bonding material 102 (see FIG. 4) to the plurality of lands 532 in the conductive region 53 corresponding to the MOSFET 6. Solder, for example, is employed as the conductive bonding material 102. The conductive bonding material 102 bonds the back surfaces and end faces of the source terminals 62 to the lands 532, for example. The conductive bonding material 102 includes a portion located between the source terminals 62 and the lands 532. The source terminals 62 are electrically connected to the output-side busbar 3, through the lands 532, the extension region 533 joined to the lands 532, the conductive piece 9 bonded to the extension region 533, and the conductive raised part 302a to which the conductive piece 9 is bonded. The conductive piece 9 functions as a relay terminal that electrically connect the source terminals 62 and the raised part 302a. The output voltage of the source terminals 62 is output externally from the output terminal part 31 of the busbar 3.

The Zener diode 7 is mounted to straddle between both the busbar 2 and the wiring board 5 that is on the busbar 3, similarly to the MOSFETs 6. The Zener diode 7 is, for example, mounted to straddle between the second portion 202 of the busbar 2 and the edge portion in which the open holes 52b are formed in the long direction of the wiring board 5. In other words, the Zener diode 7 is mounted to straddle between the second portion 202 of the busbar 2 and the portion of the wiring board 5 adjacent to the second portion 202. The insulating portion 42 (specifically, the surrounding portion 42a) is located between the second portion 202 of the busbar 2 and the busbar 3. The Zener diode 7 is provided on the busbars 2 and 3 so as to straddle the insulating portion 42.

The cathode terminal 71 of the Zener diode 7 is bonded by a conductive bonding material 111 (see FIG. 5) to the upper surface of the second portion 202 of the busbar 2. Solder, for example, is employed as the conductive bonding material 111. The conductive bonding material 111 bonds the back surface and end face of the cathode terminal 71 to the second portion 202. The conductive bonding material 111 includes a portion located between the cathode terminal 71 and the second portion 202. The cathode terminal 71 is electrically connected to the drain terminals 63 of the MOSFETs 6 through the busbar 2.

The anode terminal 72 of the Zener diode 7 is bonded to one of the raised parts 302b in one of the open holes 52b in the wiring board 5. The anode terminal 73 of the Zener diode 7 is bonded to the other raised part 302b in the other open hole 52b in the wiring board 5. In the present example, given that the raised parts 302b are constituted by part of the busbar 3, the anode terminals 72 and 73 can be said to be bonded to the upper surface of the busbar 3.

The anode terminal 72 is bonded by a conductive bonding material to the upper surface of one of the raised parts 302b. Solder, for example, is employed as the conductive bonding material. The conductive bonding material electrically bonds the back surface and end face of the distal end portion of the anode terminal 72 to the one raised part 302b. The conductive bonding material includes a portion located between the distal end portion of the anode terminal 72 and the one raised part 302b. The anode terminal 72 is electrically connected to the source terminals 62 of the MOSFETs 6 through the one raised part 302b and the busbar 3.

The anode terminal 73 is bonded by a conductive bonding material 112 (see FIG. 5) to the upper surface of the other raised part 302b. Solder, for example, is employed as the conductive bonding material 112. The conductive bonding material 112 bonds the back surface and end face of the distal end portion of the anode terminal 73 to the other raised part 302b. The conductive bonding material 112 includes a portion located between the distal end portion of the anode terminal 73 and the other raised part 302b.

Example of Manufacturing Method for Circuit Structure

Figure 10:
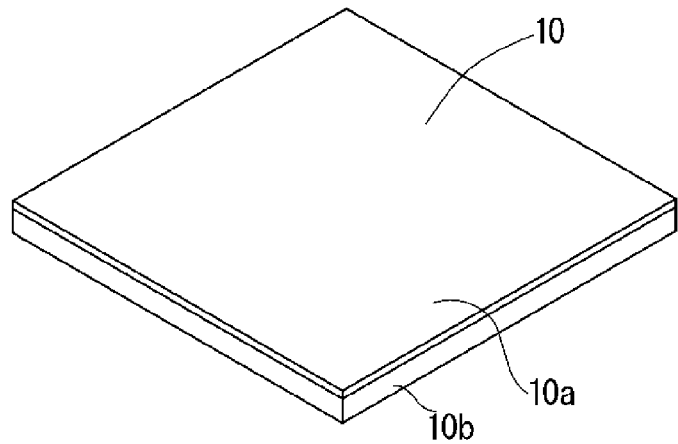
FIG. 10 is a schematic perspective view for describing an example of a manufacturing method of the circuit structure.

In the case of manufacturing the circuit structure 1A having a configuration such as the above, first, two pieces of a cladding material 10 for producing the busbars 2 and 3 are prepared. The cladding material 10 comprises metal layers 10a and 10b laminated one on the other, as shown in FIG. 10. The metal layer 10a is an aluminum layer, for example, and the metal layer 10b is a copper layer, for example. The cladding material 10 is produced by an aluminum plate and a copper plate being diffusion bonded by rolling and heat treatment, for example. The metal layer 10a forms the metal layer 250 of the busbar 2 or the metal layer 350 of the busbar 3. The metal layer 10b forms the metal layer 260 of the busbar 2 or the metal layer 360 of the busbar 3.

Next, one of the two pieces of cladding material 10 that were prepared is formed into a predetermined shape by cold forging or cutting, for example. The open hole 210 is then provided in the one piece of molded cladding material 10. The busbar 2 is thereby completed.

Figure 11:
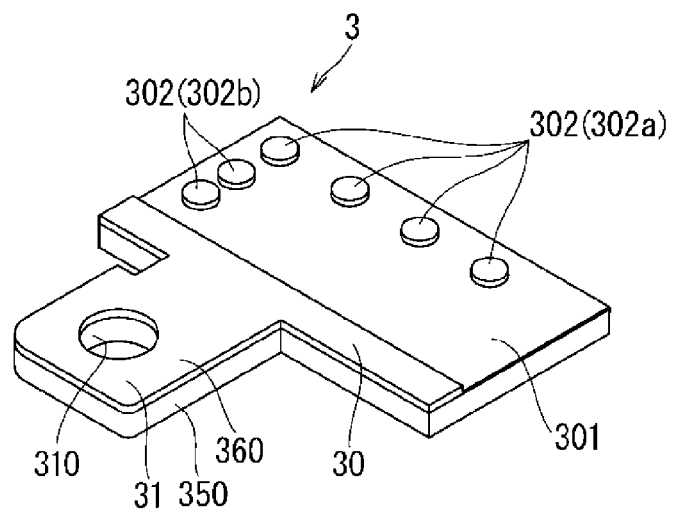
FIG. 11 is a schematic perspective view for describing an example of the manufacturing method of the circuit structure.

Also, the other piece of cladding material 10 is formed into a predetermined shape by cold forging or cutting, for example. The open hole 310 is then provided in the other piece of shaped cladding material 10. Next, the plurality of raised parts 302 are provided on the surface of the other piece of cladding material 10. The busbar 3 shown in FIG. 11 is thereby completed.

Figure 12:
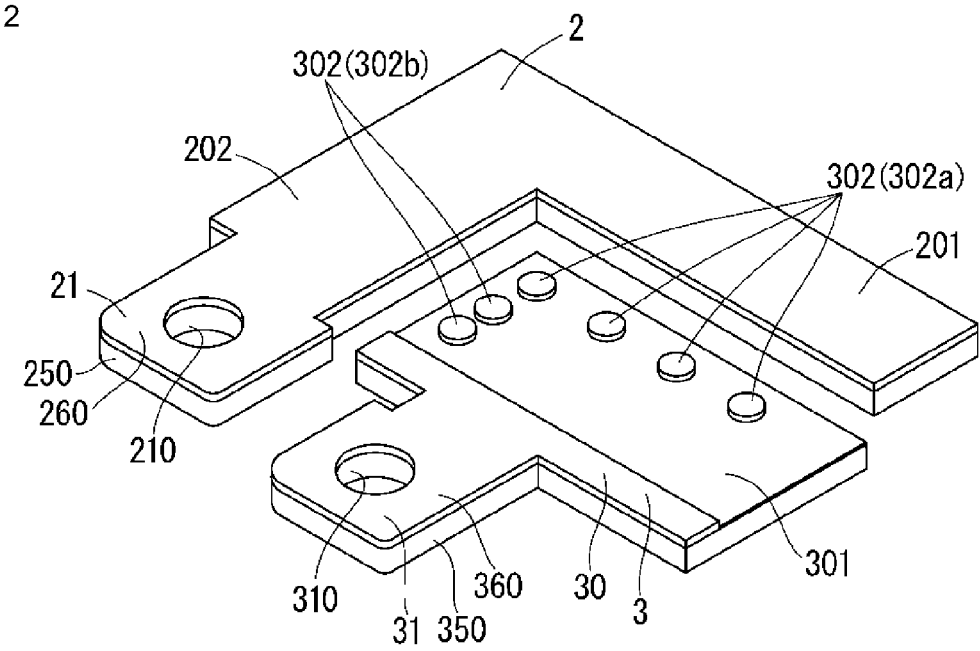
FIG. 12 is a schematic perspective view for describing an example of the manufacturing method of the circuit structure.
Figure 13:
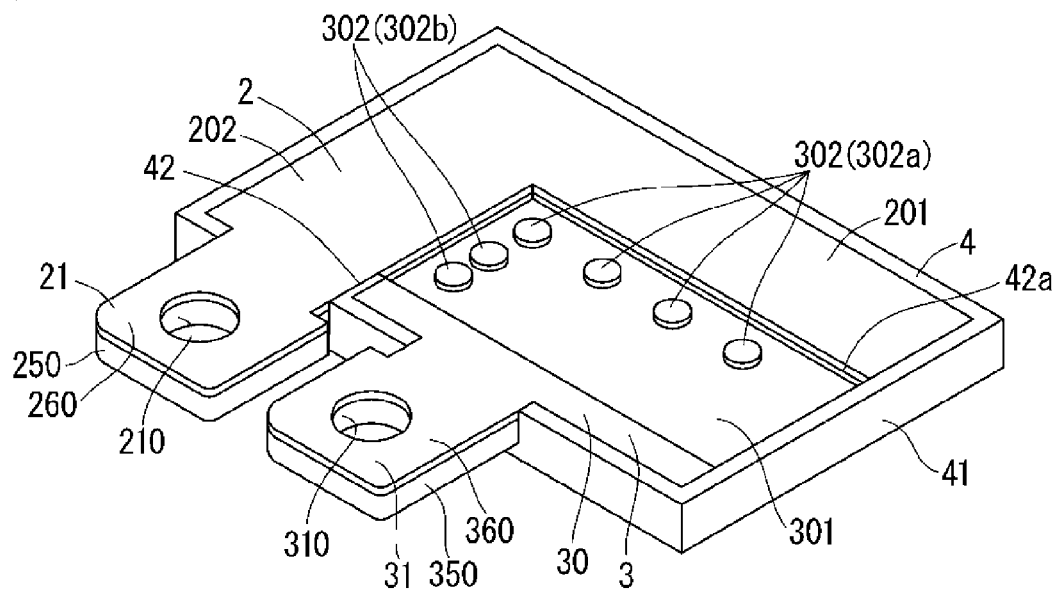
FIG. 13 is a schematic perspective view for describing an example of the manufacturing method of the circuit structure.

Next, as shown in FIG. 12, the busbars 2 and 3 are disposed in a mold for insert molding. In FIG. 12, illustration of the mold for insert molding is omitted. A thermoplastic resin having excellent heat resistance such as PPS is then injected into the mold for insert molding from an injection molding machine, and the busbars 2 and 3 and the resin are molded as one piece. As shown in FIG. 13, an integrally molded article in which the busbars 2 and 3 and the insulating member 4 are molded as one piece is thereby obtained.

Next, the wiring board 5 is fixed by a bonding material such as double-sided adhesive tape to the board mounting region 301 of the busbar 3 included in the produced integrally molded article. The structure shown in FIG. 9 mentioned above is thereby obtained.

Figure 14:
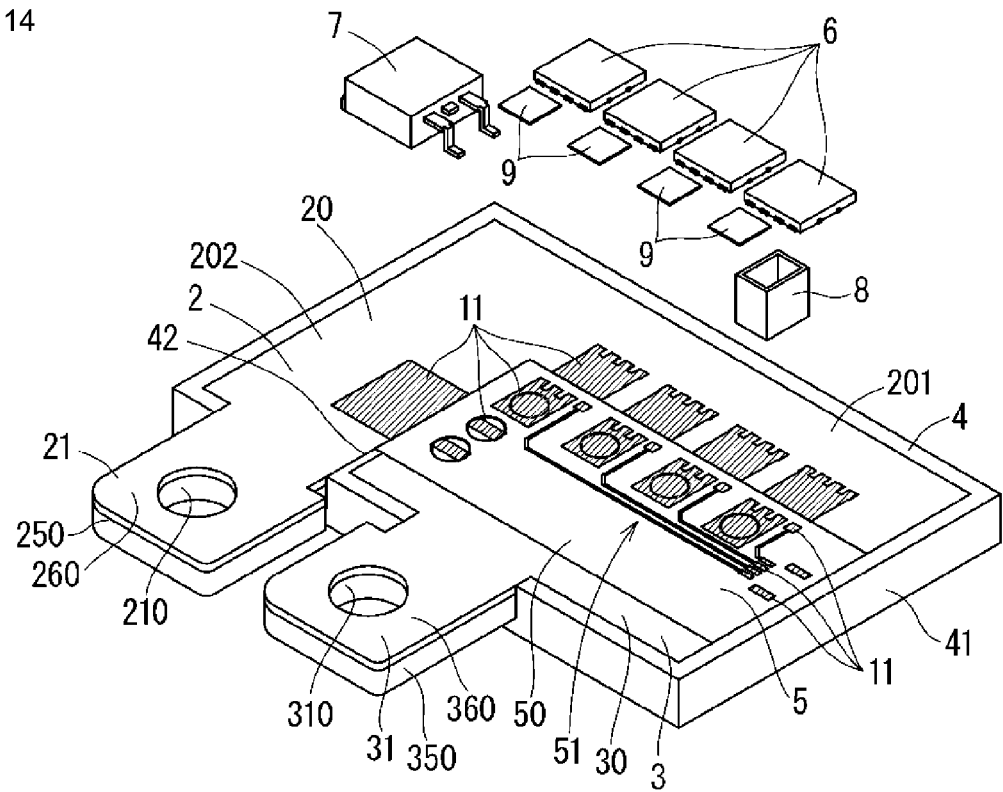
FIG. 14 is a schematic perspective view for describing an example of the manufacturing method of the circuit structure.

Next, as shown in FIG. 14, a solder paste 11 is applied to predetermined regions of the upper surfaces of the busbar 2, the busbar 3 and the wiring board 5. In FIG. 14, the solder paste 11 is shaded. The plurality of MOSFETs 6, the Zener diode 7, the connector 8 and the plurality of conductive pieces 9 are then soldered with a reflow method to the regions to which the solder paste 11 was applied. The above-described circuit structure 1A shown in FIGS. 1, 2 and other diagrams is thereby completed.

Figure 15:
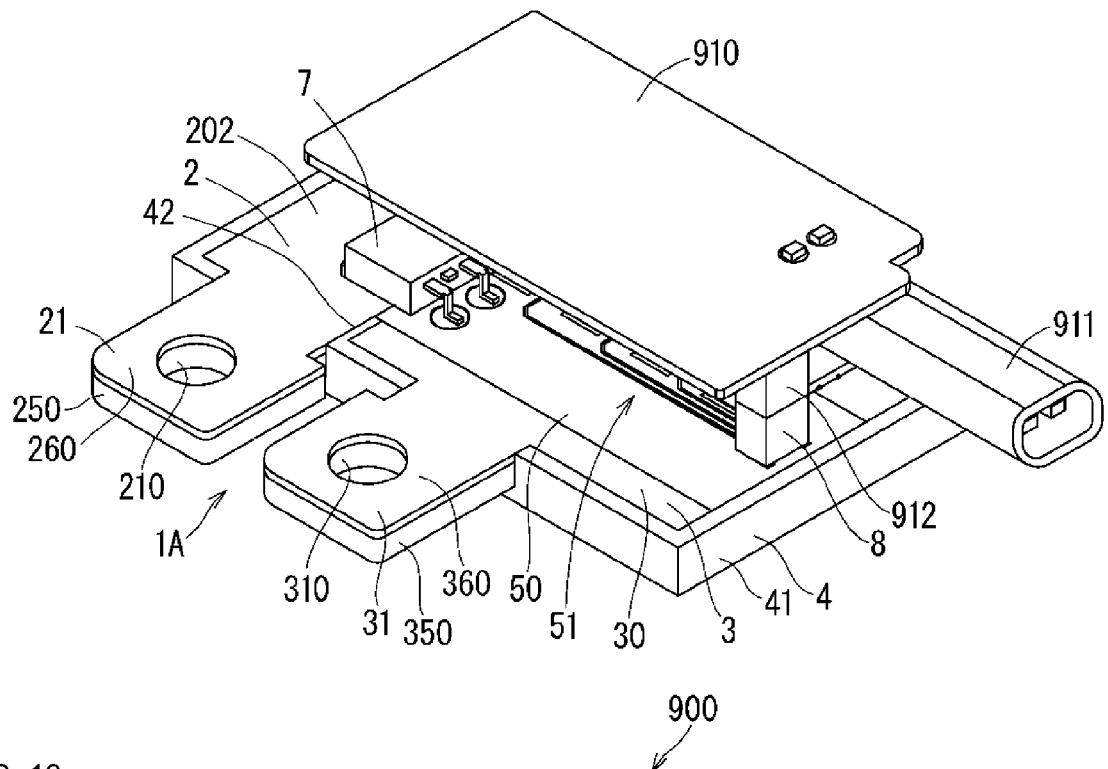
FIG. 15 is a schematic perspective view for describing an example of a manufacturing method for an electrical junction box.

Thereafter, as shown in FIG. 15, a control board 910 that controls the MOSFETs 6 is attached to the circuit structure 1A. The control board 910 includes a microcomputer, connectors 911 and 912 and the like, for example. The connector 912 is connected to the connector 8 of the circuit structure 1A. The control board 910 is electrically connected to the gate terminals 61 of the MOSFETs 6 through the connector 912 and the connector 8 connected thereto. The control board 910 is thereby able to perform switching control of the MOSFETs 6. A wiring member extending from an external device is connected to the connector 911. The control board 910 performs switching control of the MOSFETs 6, in response to instructions from the external device.

Figure 16:
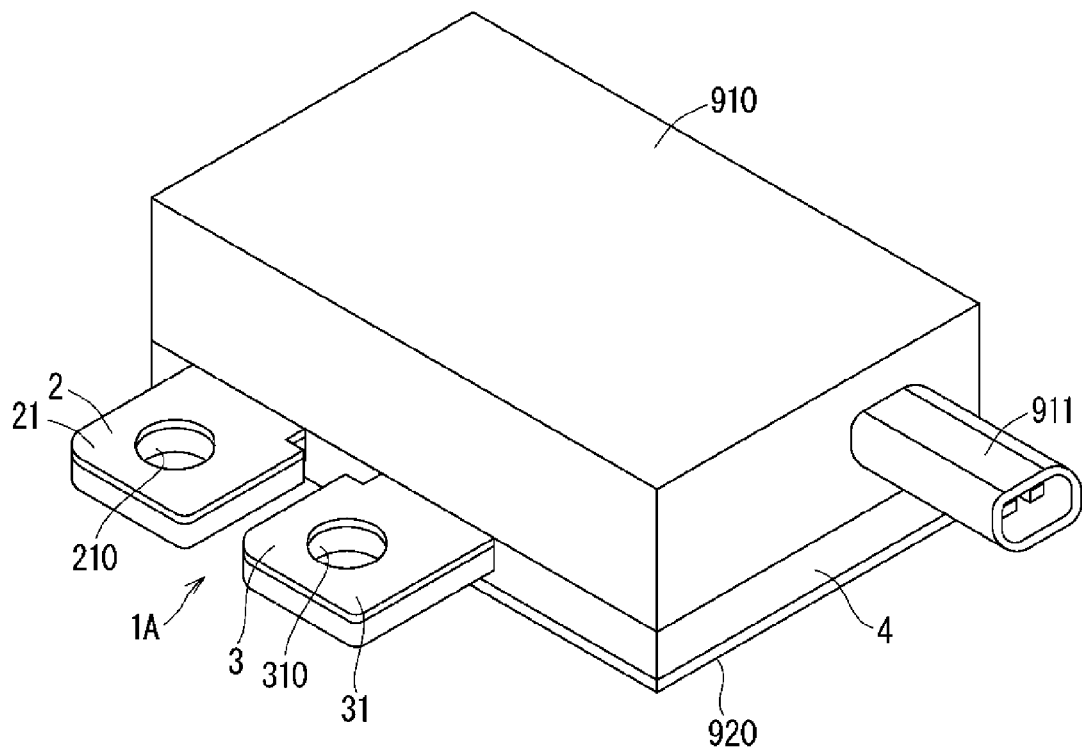
FIG. 16 is a schematic perspective view showing an example of an electrical junction box.

Next, as shown in FIG. 16, a heat sink 920 is attached to the back surfaces of the busbars 2 and 3 via a heat conductive member such as a heat dissipation sheet. Heat that is generated by the circuit structure 1A is thereby dissipated externally through the heat sink 920. A case 930 covering the wiring board 5, the plurality of MOSFETs 6, the Zener diode 7, the connector 8 and the plurality of conductive pieces 9 is then attached to the busbars 2 and 3. The electrical junction box 900 is thereby completed.

As described above, in the present example, given that the busbar 2 is constituted by a cladding material, the linear expansion coefficient of the busbar 2 as a whole can be approximated to the linear expansion coefficient of the insulating member 4, together with bonding of the drain terminals 63 of the MOSFETs 6 to the busbar 2 being facilitated.

Consider the case where, for example, the upper metal layer 260 is constituted by a copper layer and the lower metal layer 250 is constituted by an aluminum layer, as in the above example. In this case, given that the portion to which the drain terminals 63 are bonded is constituted by copper which is easily soldered, bonding of the drain terminals 63 to the busbar 2 is facilitated. Also, given that the lower metal layer 250 is constituted by an aluminum layer having a linear expansion coefficient that is relatively close to the linear expansion coefficient of the insulating member 4, the linear expansion coefficient of the busbar 2 as a whole can be approximated to the linear expansion coefficient of the insulating member 4.

In contrast, consider the case where the busbar 2 is constituted by only copper (e.g., oxygen-free copper), unlike the present example. In this case, although the drain terminals 63 are easily soldered to the busbar 2, the linear expansion coefficient of the busbar 2 (e.g., 17 ppm/° C.) will differ greatly from the linear expansion coefficient of the insulating member 4 (e.g., 40 ppm/° C.). Given that the MOSFETs 6 are provided on the busbars 2 and 3 so as to straddle the insulating portion 42 of the insulating member 4, if the linear expansion coefficient of the busbar 2 differs from the linear expansion coefficient of the insulating member 4, thermal stress could possibly occur in the bonding portion of the drain terminals 63 and the busbar 2, according to changes in ambient temperature. Cracks may thereby occur in this bonding portion, and the reliability of the bonding portion could decrease.

Also, consider the case where the busbar 2 is constituted by only aluminum (e.g., pure aluminum). In this case, the linear expansion coefficient of the busbar 2 (e.g., 24 ppm/° C.) will approximate the linear expansion coefficient of the insulating member 4, compared with the case where the busbar 2 is constituted by only copper. Accordingly, thermal stress is less likely to occur in the bonding portion of the drain terminals 63 and the busbar 2, as compared with the case where the busbar 2 is constituted by only copper. However, given that it is difficult to solder the drain terminals 63 to the busbar 2 made of aluminum, it becomes difficult to bond the drain terminals 63 to the busbar 2. As a result, the drain terminals 63 and the busbar 2 cannot be appropriately bonded, and the reliability of the bonding portion of the drain terminals 63 and the busbar 2 could decrease.

In the present example, given that the busbar 2 is constituted by a cladding material, a material that bonds easily can be used as the material of the portion of the busbar 2 to which the drain terminals 63 of the MOSFETs 6 are bonded, as in the above example. Thus, the drain terminals 63 can be easily bonded to the busbar 2. On the other hand, the linear expansion coefficient of a material that bonds easily may differ greatly from the linear expansion coefficient of the insulating member 4. Even in this case, by selecting a material whose linear expansion coefficient is close to the linear expansion coefficient of the insulating member 4 as the material of other portions constituting the busbar 2, the linear expansion coefficient of the busbar 2 as a whole can be approximated to the linear expansion coefficient of the insulating member 4. Thermal stress is thereby less likely to occur in the bonding portion of the drain terminals 63 and the busbar 2, together with bonding of the drain terminals 63 to the busbar 2 being facilitated. As a result, the reliability of the bonding portion improves. Also, since heat generated by the MOSFETs 6 can be transferred directly to the busbar 2, local increases in temperature are less likely to occur. Similarly, thermal stress is less likely to occur in the bonding portion of the cathode terminal 71 and the busbar 2, together with bonding of the cathode terminal 71 to the busbar 2 being facilitated. As a result, the reliability of the bonding portion improves.

In the present example, given that the busbar 3 is constituted by a cladding material, the linear expansion coefficient of the entire busbar 3 can be approximated to the linear expansion coefficient of the insulating member 4, together with bonding of the anode terminals 72 and 73 of the Zener diode 7 to the busbar 3 (specifically, the raised parts 302b) being facilitated. Thermal stress is thereby less likely to occur in the bonding portion of the anode terminals 72 and 73 and the busbar 3, together with bonding of the anode terminals 72 and 73 to the busbar 3 being facilitated. As a result, the reliability of the bonding portion improves.

In the present example, given that the busbar 2 includes the metal layer 250 and the metal layer 260 laminated thereon, the busbar 2 made of a cladding material can be easily produced by laminating the metal layers 250 and 260. Also, in the case where the metal layer that is used as the metal layer 260 bonds more easily to the drain terminals 63 and the cathode terminal 71 than does the metal layer 250, the linear expansion coefficient of the busbar 2 as a whole can be approximated to the linear expansion coefficient of the insulating member 4, while at the same time facilitating bonding of the drain terminals 63 and the cathode terminal 71 to the metal layer 260. Similarly, the busbar 3 made of a cladding material can be easily produced by laminating the metal layers 350 and 360. Also, in the case where the metal layer that is used as the metal layer 360 bonds more easily to the anode terminals 72 and 73 than does the metal layer 350, the linear expansion coefficient of the busbar 3 as a whole can be approximated to the linear expansion coefficient of the insulating member 4, while at the same time facilitating bonding of the anode terminals 72 and 73 to the metal layer 360.

Also, with the busbar 2 according to the present example, given that the metal layer 250 is an aluminum layer and the metal layer 260 is a copper layer, the busbar 2 made of a cladding material can be easily produced using aluminum and copper. Also, copper bonds more easily to the drain terminals 63 and the cathode terminal 71 than aluminum, whereas aluminum has a linear expansion coefficient closer to the insulating member 4 than copper. Accordingly, the linear expansion coefficient of the busbar 2 as a whole can be approximated to the linear expansion coefficient of the insulating member 4, while at the same time facilitating bonding of the drain terminals 63 and the cathode terminal 71 to the metal layer 260. Similarly, the busbar 3 made of a cladding material can be easily produced using aluminum and copper. Also, copper bonds more easily to the anode terminals 72 and 73 than aluminum, whereas aluminum has a linear expansion coefficient closer to the insulating member 4 than copper. Accordingly, the linear expansion coefficient of the busbar 3 as a whole can be approximated to the linear expansion coefficient of the insulating member 4, while at the same time facilitating bonding of the anode terminals 72 and 73 to the metal layer 360.

Also, in the present example, given that the linear expansion coefficient of the metal layer 250 is closer to the linear expansion coefficient of the insulating member 4 than is the linear expansion coefficient of the metal layer 260, a metal layer having a linear expansion coefficient close to the linear expansion coefficient of the insulating member 4 can be employed as the metal layer 250, without considering bondability to the drain terminals 63 and the cathode terminal 71. Similarly, given that the linear expansion coefficient of the metal layer 350 is closer to the linear expansion coefficient of the insulating member 4 than is the linear expansion coefficient of the metal layer 360, a metal layer having a linear expansion coefficient close to the linear expansion coefficient of the insulating member 4 can be employed as the metal layer 350, without considering bondability to the anode terminals 72 and 73.

Also, in the present example, the upper end face of the insulating portion 42 of the insulating member 4 is flush with the upper surface of the lower metal layer 250 having a linear expansion coefficient close to the linear expansion coefficient of the insulating member 4 (e.g., see FIG. 4). The upper metal layer 260 is thereby less likely to be affected by deformation of the insulating portion 42 caused by changes in ambient temperature. As a result, thermal stress is less likely to occur in the bonding portion of the upper metal layer 260 and the drain terminals 63 and cathode terminal 71. Accordingly, a metal layer having a large difference in linear expansion coefficient from the insulating member 4 can be used as the metal layer 260.

Also, in the present example, the upper end face of the insulating portion 42 is flush with the upper surface of the lower metal layer 350 having a linear expansion coefficient close to the linear expansion coefficient of the insulating member 4 (e.g., see FIG. 5). The upper metal layer 360 is thereby less likely to be affected by deformation of the insulating portion 42 caused by changes in ambient temperature. As a result, thermal stress is less likely to occur in the bonding portion of the upper metal layer 360 and the anode terminals 72 and 73. Accordingly, a metal layer having a large difference in linear expansion coefficient from the insulating member 4 can be used as the metal layer 360.

Also, in the present example, the upper end face of the insulating portion 42 is flush with the upper surface of the lower metal layer 250 and the lower metal layer 350, and the lower metal layer 250 and the lower metal layer 350 are constituted by the same type of metal, such as aluminum, for example. The distribution of thermal stress in a direction along the upper surfaces of both the lower metal layer 250 and the lower metal layer 350 thus occurs symmetrically across the insulating member 4 (left-right direction in FIG. 3 to FIG. 5), and the thermal stresses that occur on both sides cancel each other out. As a result, thermal stress is less likely to occur in the bonding portions of the upper metal layer 260 and the drain terminals 63 and cathode terminal 71 (e.g., see FIGS. 3 and 5), and the reliability of the bonding portions improves. Similarly, thermal stress is less likely to occur in the bonding portions (e.g., see FIGS. 3 and 4) of the wiring board 5 on the upper metal layer 360 and the gate terminals 61 and source terminals 62, and the reliability of the bonding portions improves. Similarly, thermal stress is less likely to occur in the bonding portions of the upper metal layer 360 and the anode terminals 72 and 73 (e.g., see FIG. 5), and the reliability of the bonding portions improves.

Also, by increasing the thickness of the lower metal layer 250 having a linear expansion coefficient close to the linear expansion coefficient of the insulating member 4 to greater than the thickness of the upper metal layer 260, as in the present example, the linear expansion coefficient of the busbar 2 as a whole can be further approximated to the linear expansion coefficient of the insulating member 4. As a result, thermal stress is less likely to occur in the bonding portion of the drain terminals 63 and the busbar 2, and the reliability of the bonding portion further improves. Similarly, by increasing the thickness of the lower metal layer 350 to greater than the thickness of the upper metal layer 360, the linear expansion coefficient of the entire busbar 3 can be further approximated to the linear expansion coefficient of the insulating member 4. As a result, the reliability of the bonding portion of the anode terminals 72 and 73 and the busbar 3 further improves.

Also, in the present example, given that the busbar 2, the busbar 3 and the insulating member 4 are molded as one piece, a member for integrating the busbar 2, the busbar 3 and the insulating member 4 is not required. The configuration of the circuit structure 1A can thereby be simplified.

Also, in the present example, the conductive raised parts 302a protrude from the busbar 3 into the open holes 52a in the wiring board 5. By electrically connecting the source terminals 62 on the wiring board 5 to the raised parts 302a in the open holes 52a, the source terminals 62 can thus be easily electrically connected to the busbar 3.

Also, in the present example, the conductive raised parts 302b protrude from the busbar 3 into the open holes 52b in the wiring board 5. By electrically connecting the anode terminals 72 and 73 on the wiring board 5 to the raised parts 302b in the open holes 52b, the anode terminals 72 and 73 can thus be easily electrically connected to the busbar 3.

In the present example, given that the raised parts 302 are constituted by part of the busbar 3, electrical resistance between the source terminals 62 and the busbar 3 can be reduced, and also electrical resistance between the anode terminals 72 and 73 and the busbar 3 can be reduced.

Also, in the present example, given that the anode terminals 72 and 73 are bonded to the raised parts 302b, as shown in FIGS. 2, 5 and other diagrams, electrical resistance between the anode terminals 72 and 73 and the busbar 3 can be reduced.

Also, in the present example, the conductive pieces 9 bonded to the extension regions 533 that extend from the lands 532 to which the source terminals 62 are bonded and are located around the open holes 52a and to the upper surfaces of the raised parts 302a in the open holes 52a are provided. Due to these conductive pieces 9, electrical resistance between the source terminals 62 and the busbar 3 can be reduced. Also, given that transfer of heat generated by the MOSFETs 6 to the busbar 3 is facilitated by the conductive pieces 9, local increases in temperature are less likely to occur.

Also, in the present example, the extension regions 533 surround the open holes 52a, and the conductive pieces 9 cover the opening edges of the open holes 52a. The bonding area of the conductive pieces 9 and the extension regions 533 and raised parts 302a can thereby be increased. As a result, electrical resistance between the source terminals 62 and the busbar 3 can be further reduced.

Also, in the present example, given that the wiring board 5 is located on the board mounting region 301, which is lower than the upper surface of the busbar 2, on the upper surface of the busbar 3, a difference in level between the wiring board 5 and the busbar 2 can be suppressed. Therefore, the MOSFETs 6 and the Zener diode 7 can be easily provided to straddle between the wiring board 5 and the busbar 2.

Also, in the present example, given that the gate terminals 61 and source terminals 62 of the MOSFETs 6 are insulated on the wiring board 5, the gate terminals 61 and the source terminals 62 can be appropriately insulated, even if the spacing of the gate terminals 61 and the source terminals 62 decreases. Therefore, a package having a narrow pitch in which the terminal spacing is narrow can be employed as the package 60.

Note that the linear expansion coefficient of the wiring board 5 may be closer to the linear expansion coefficient of the insulating member 4 (e.g., 40 ppm/° C.) than are the linear expansion coefficients of the upper metal layers 260 and 360 (e.g., 17 ppm/° C.). The linear expansion coefficient of the wiring board 5 may, for example, be 18 ppm/° C. or greater. The linear expansion coefficient of the wiring board 5 may be closer to the linear expansion coefficient of the insulating member 4 (e.g., 40 ppm/° C.) than are the linear expansion coefficients of the lower metal layers 250 and 350 (e.g., 24 ppm/° C.). The linear expansion coefficient of the wiring board 5 may, for example, be 25 ppm/° C. or greater. Thermal stress is thereby less likely to occur in the bonding portion of the wiring board 5 and the gate terminals 61 and source terminals 62. As a result, the reliability of the bonding portion improves.

Also, in the case of connecting the connection terminal of the wiring member extending from the battery to the input terminal part 21 of the busbar 2, the connection terminal of the wiring member may be brought in contact with the upper metal layer 260. The conductivity of the upper metal layer 260 is greater than the conductivity of the lower metal layer 250. By bringing the connection terminal of the wiring member in contact with the upper metal layer 260, electrical resistance between the input terminal part 21 and the battery can be reduced.

Also, in the case of connecting the connection terminal of the wiring member extending from an electrical component to the output terminal part 31 of the busbar 3, the connection terminal of the wiring member may be brought in contact with the upper metal layer 360. The conductivity of the upper metal layer 360 is greater than the conductivity of the lower metal layer 350. By bringing the connection terminal of the wiring member in contact with the upper metal layer 360, electrical resistance between the output terminal part 31 and the electrical component can be reduced.

Embodiment 2

Figure 17:
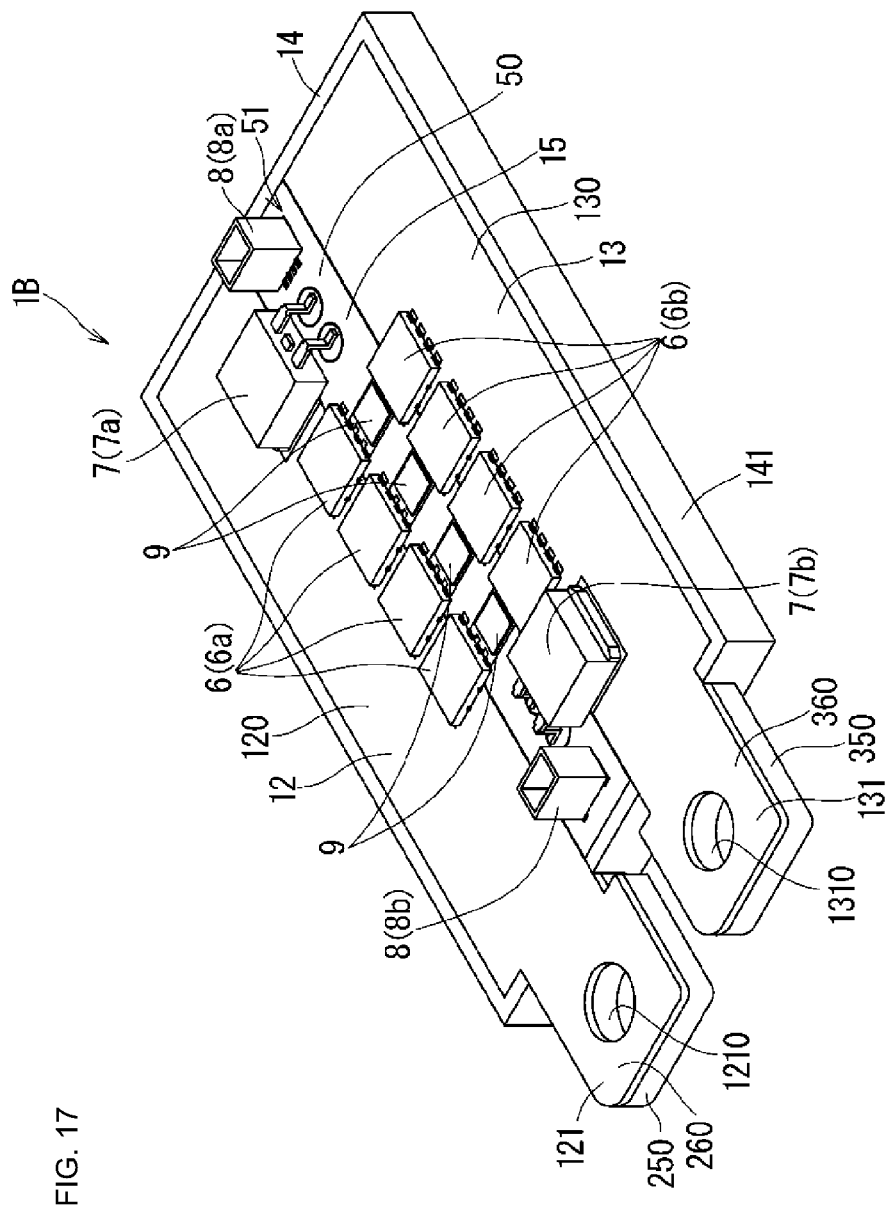
FIG. 17 is a schematic perspective view showing an example of a circuit structure.
Figure 18:
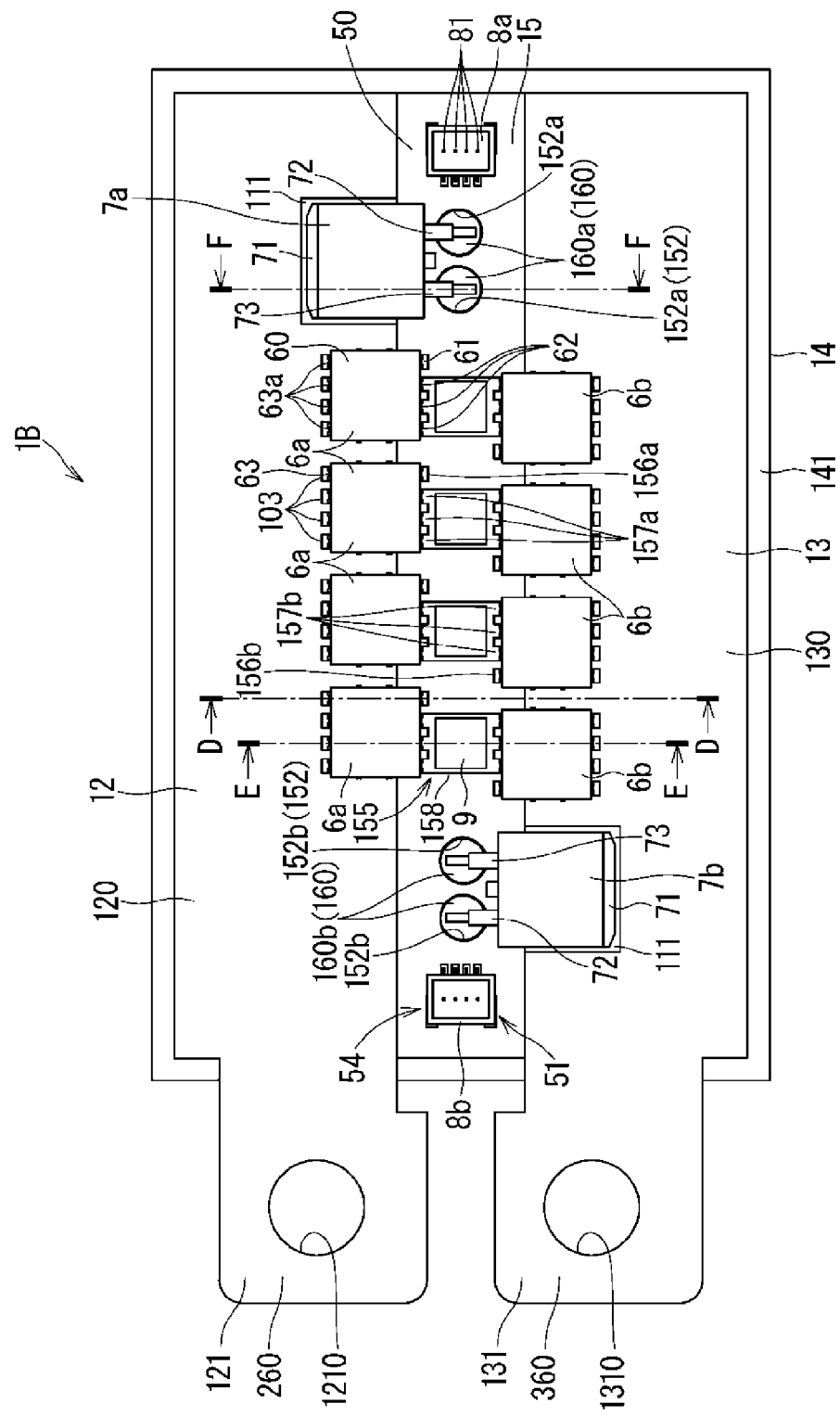
FIG. 18 is a schematic plan view showing an example of the circuit structure.
Figure 19:
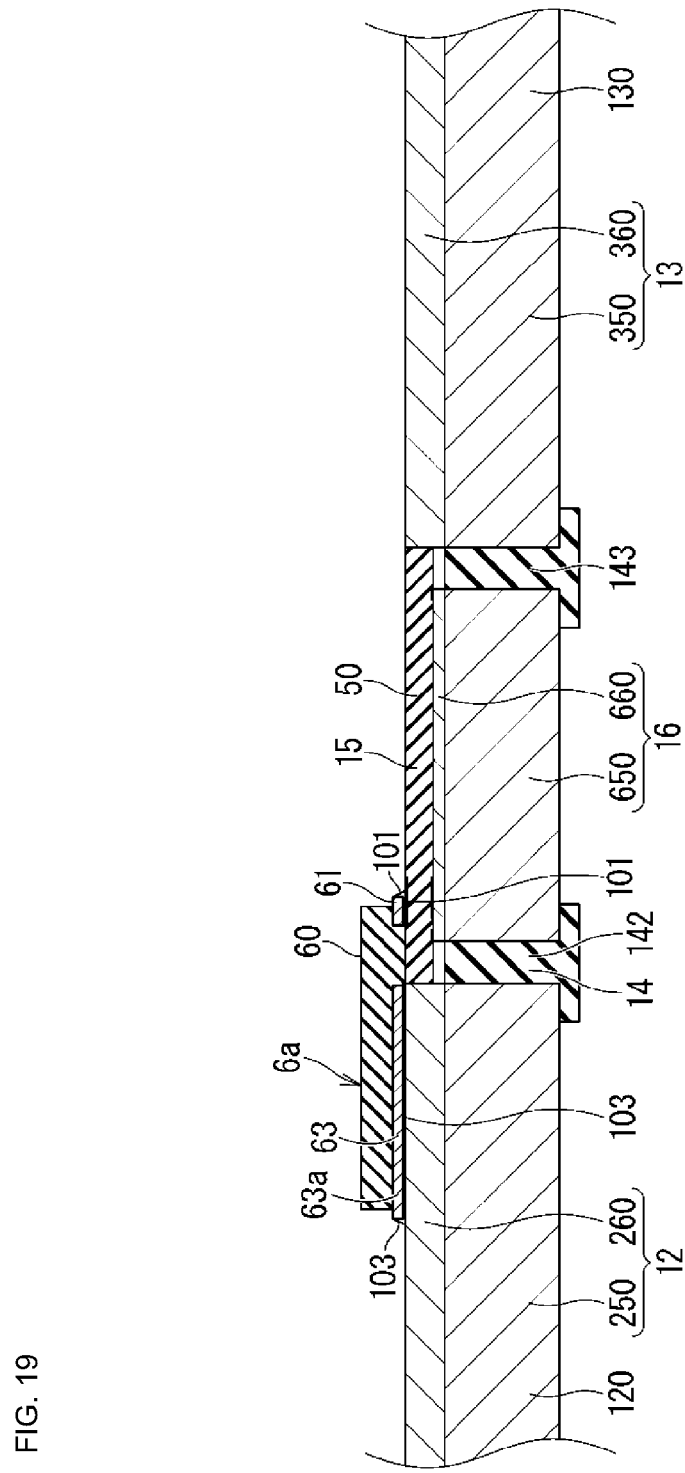
FIG. 19 is a schematic view showing an example of the cross-sectional structure of the circuit structure.
Figure 20:
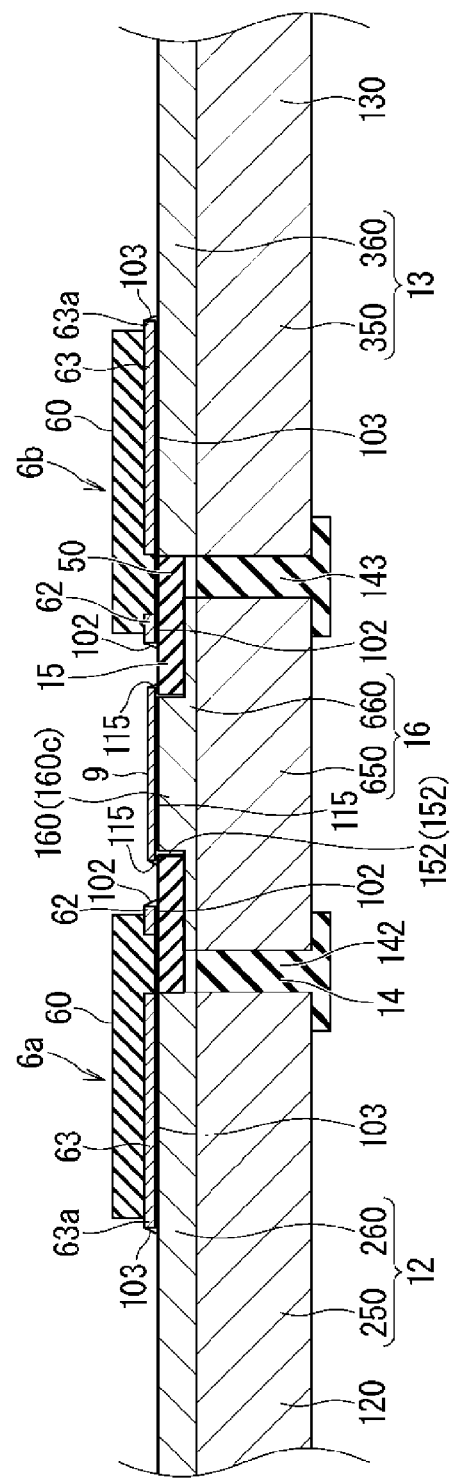
FIG. 20 is a schematic view showing an example of the cross-sectional structure of the circuit structure.
Figure 21:
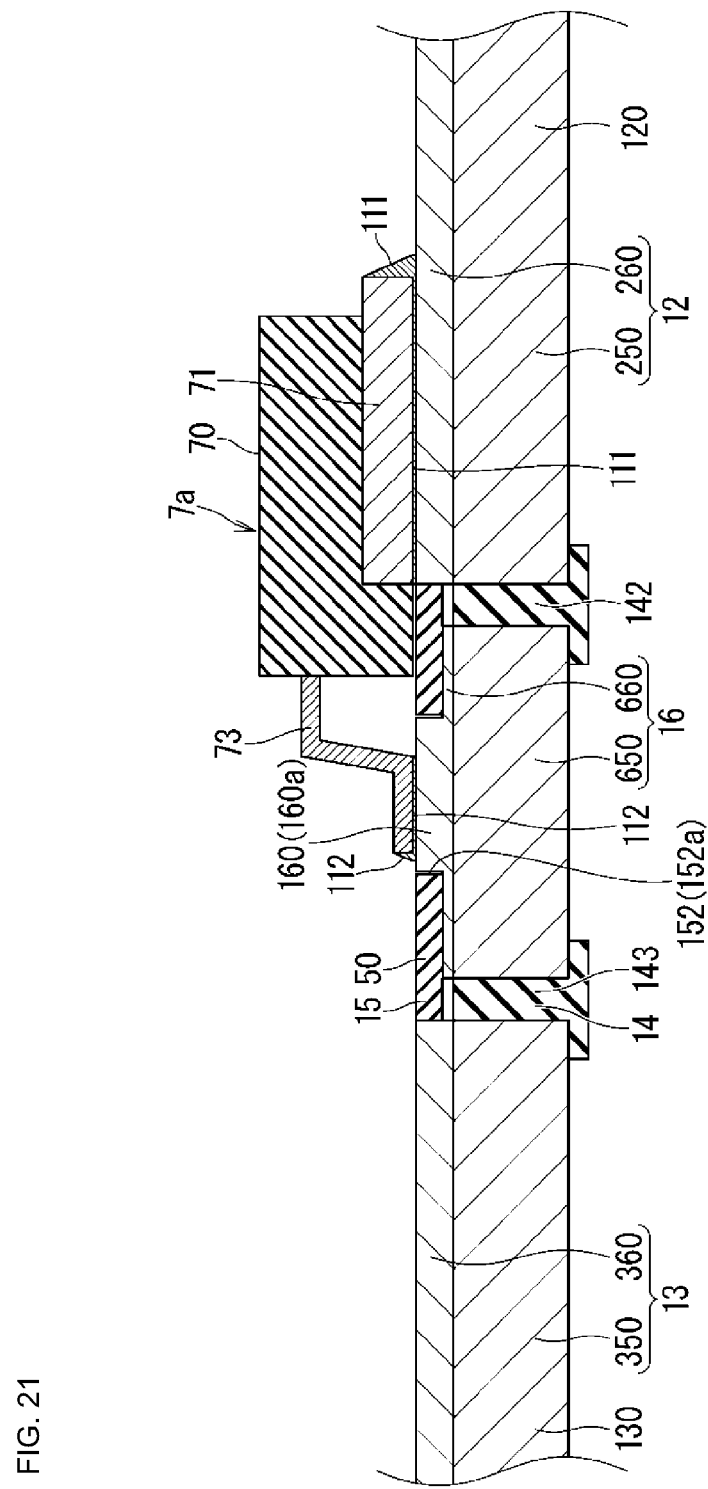
FIG. 21 is a schematic view showing an example of the cross-sectional structure of the circuit structure.
Figure 22:
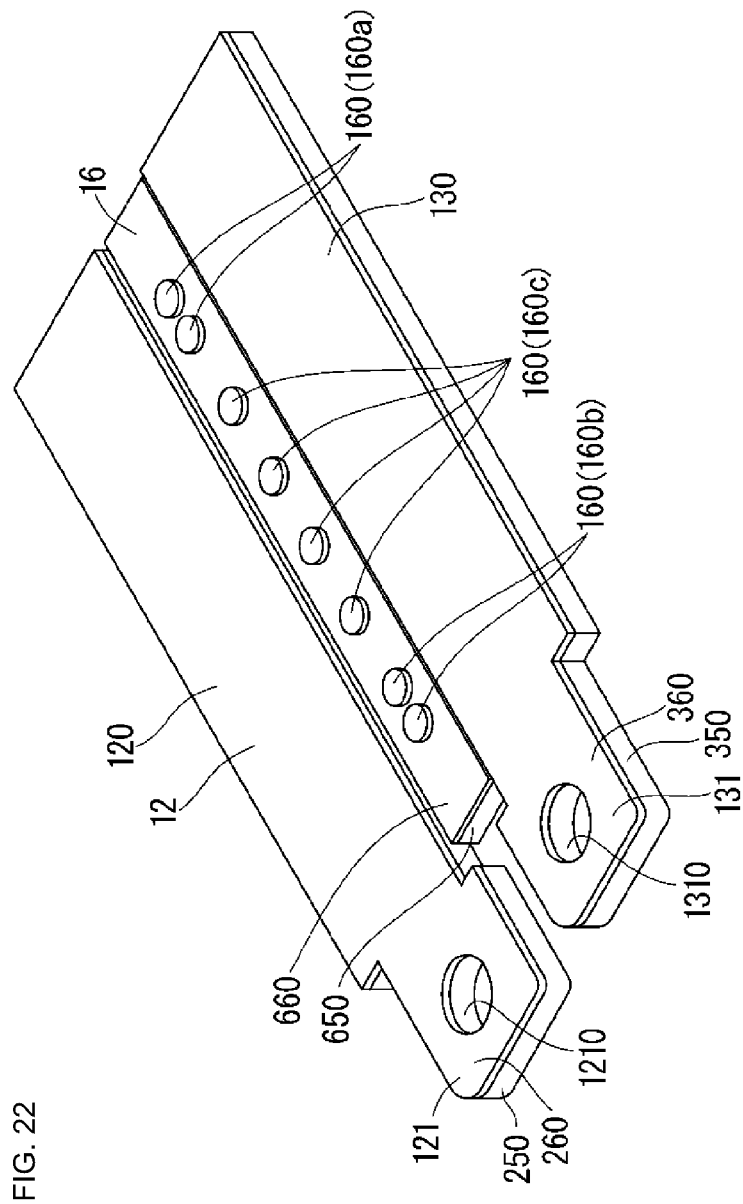
FIG. 22 is a schematic perspective view showing an example of the configuration of part of the circuit structure.

FIG. 17 is a schematic perspective view showing an example of a circuit structure 1B according to the present embodiment. FIG. 18 is a schematic plan view showing an example of the circuit structure 1B. FIG. 19 is a schematic view showing an example of the cross-sectional structure taken along a line indicated by arrows D-D in FIG. 18. FIG. 20 is a schematic view showing an example of the cross-sectional structure taken along a line indicated by arrows E-E in FIG. 18. FIG. 21 is a schematic view showing an example of the cross-sectional structure taken along a line indicated by arrows F-F in FIG. 18. FIG. 22 is a schematic perspective view showing an example of an input-side busbar 12, an output-side busbar 13 and a relay busbar 16 that are included in the circuit structure 1B. Hereinafter, the structure of the circuit structure 1B will be described focusing on the differences from the circuit structure 1A described above.

Outline of Circuit Structure

The circuit structure 1B includes the input-side busbar 12 (also simply referred to as busbar 12), the output-side busbar 13 (also simply referred to as busbar 13), the relay busbar 16 (also simply referred to as busbar 16) and a wiring board 15. The busbars 12, 13 and 16 are conductive members. The circuit structure 1B further includes the above-described MOSFET 6, Zener diode 7, connector 8 and conductive piece 9. In the present example, the circuit structure 1B includes eight MOSFETs 6, two Zener diodes 7, two connectors 8 and four conductive pieces 9, for example. Note that the numbers of MOSFETs 6, Zener diodes 7, connectors 8 and conductive pieces 9 included in the circuit structure 1B are not limited thereto.

The drain terminals 63 of four of the eight MOSFETs 6 and the cathode terminal 71 of one of the two Zener diodes 7 are electrically connected to the input-side busbar 12. The drain terminals 63 of the four MOSFETs 6 and the cathode terminal 71 of the one Zener diode 7 are thereby electrically connected to each other.

The drain terminals 63 of the remaining four of the eight MOSFETs 6 and the cathode terminal 71 of the other of the two Zener diodes 7 are electrically connected to the output-side busbar 13. The drain terminals 63 of the remaining four MOSFETs 6 and the cathode terminal 71 of the other Zener diode 7 are thereby electrically connected to each other.

The source terminals 62 of the eight MOSFETs 6 and the anode terminals 72 and 73 of the two Zener diodes 7 are electrically connected to the relay busbar 16. The source terminals 62 of the eight MOSFETs 6 and the anode terminals 72 and 73 of the two Zener diodes 7 are thereby electrically connected to each other.

Hereafter, the MOSFETs 6 whose drain terminal 63 is electrically connected to the busbar 12 may be referred to as MOSFETs 6a. Also, the MOSFETs 6 whose drain terminal 63 is electrically connected to the busbar 13 may be referred to as MOSFETs 6b. Also, the Zener diode 7 whose cathode terminal 71 is electrically connected to the busbar 12 may be referred to as Zener diode 7a. Also, the Zener diode 7 whose cathode terminal 71 is electrically connected to the busbar 13 may be referred to as Zener diode 7b.

The input-side busbar 12 is modified in shape from the busbar 2 of the circuit structure 1A described above. The busbar 12 is a plate-shaped metal member elongated in one direction, for example. The upper surface and lower surface of the busbar 12 are flat, for example. The busbar 12 includes a main body part 120 and an input terminal part 121, for example. The main body part 120 is a rectangular plate-shaped portion, for example. The drain terminals 63 of the MOSFETs 6a and the cathode terminal 71 of the Zener diode 7a are electrically connected to the main body part 120. The input terminal part 121 protrudes from one edge of the main body part 120 in the long direction thereof. The input terminal part 121 has an open hole 1210 that passes through in the thickness direction thereof. A wiring member extending from the battery is connected to the input terminal part 121 by utilizing the open hole 1210, for example. The output voltage of the battery is applied to the input terminal part 121 through the wiring member. The output voltage of the battery applied to the input terminal part 121 is applied to the drain terminals of the MOSFETs 6a through the main body part 120.

The output-side busbar 13 is modified in shape from the busbar 3 of the circuit structure 1A. The busbar 13 is a plate-shaped metal member elongated in one direction, similarly to the busbar 12. The busbar 13 has the shape of the busbar 12 inverted with the long direction thereof as the axis of symmetry. The busbar 13 includes a main body part 130 and an output terminal part 131, for example. The main body part 130 is a rectangular plate-shaped portion, for example. The main body part 130 is electrically connected to the drain terminals 63 of the MOSFETs 6b and the cathode terminal 71 of the Zener diode 7b. The output terminal part 131 protrudes from one edge of the main body part 130 in the long direction thereof. The output terminal part 131 has an open hole 1310 that passes through in the thickness direction thereof. A wiring member extending from an electrical component is connected to the output terminal part 131 by utilizing the open hole 1310, for example. The voltage that is output by the drain terminals of the MOSFETs 6b is applied to the output terminal part 131. The voltage applied to the output terminal part 131 is applied as a power supply to the electrical component through the wiring member, for example.

As shown in FIG. 22, the relay busbar 16 is a rectangular plate-shaped metal member, for example. The busbars 12, 13 and 16 are located in the same plane, for example. The busbars 12 and 13 are disposed opposing each other with a gap therebetween such that the long directions thereof are parallel to each other. The busbar 16 is located between the busbars 12 and 13 such that the long direction thereof is parallel to the long directions of the busbars 12 and 13. The busbar 16 is located between the main body part 120 of the busbar 12 and the main body part 130 of the busbar 13. The busbar 16 is electrically connected to the source terminals 62 of the eight MOSFETs 6 and the anode terminals 72 and 73 of the two Zener diodes 7.

An insulating member 14 is modified in shape from the insulating member 4 of the circuit structure 1A. The insulating member 14 holds the busbars 12, 13 and 16, while at the same time electrically insulating the busbars 12, 13 and 16 from each other. The insulating member 14 is molded as one piece with the busbars 12, 13 and 16, for example. The insulating member 14 is molded as one piece with the busbars 12, 13 and 16 by insert molding, for example.

Figure 23:
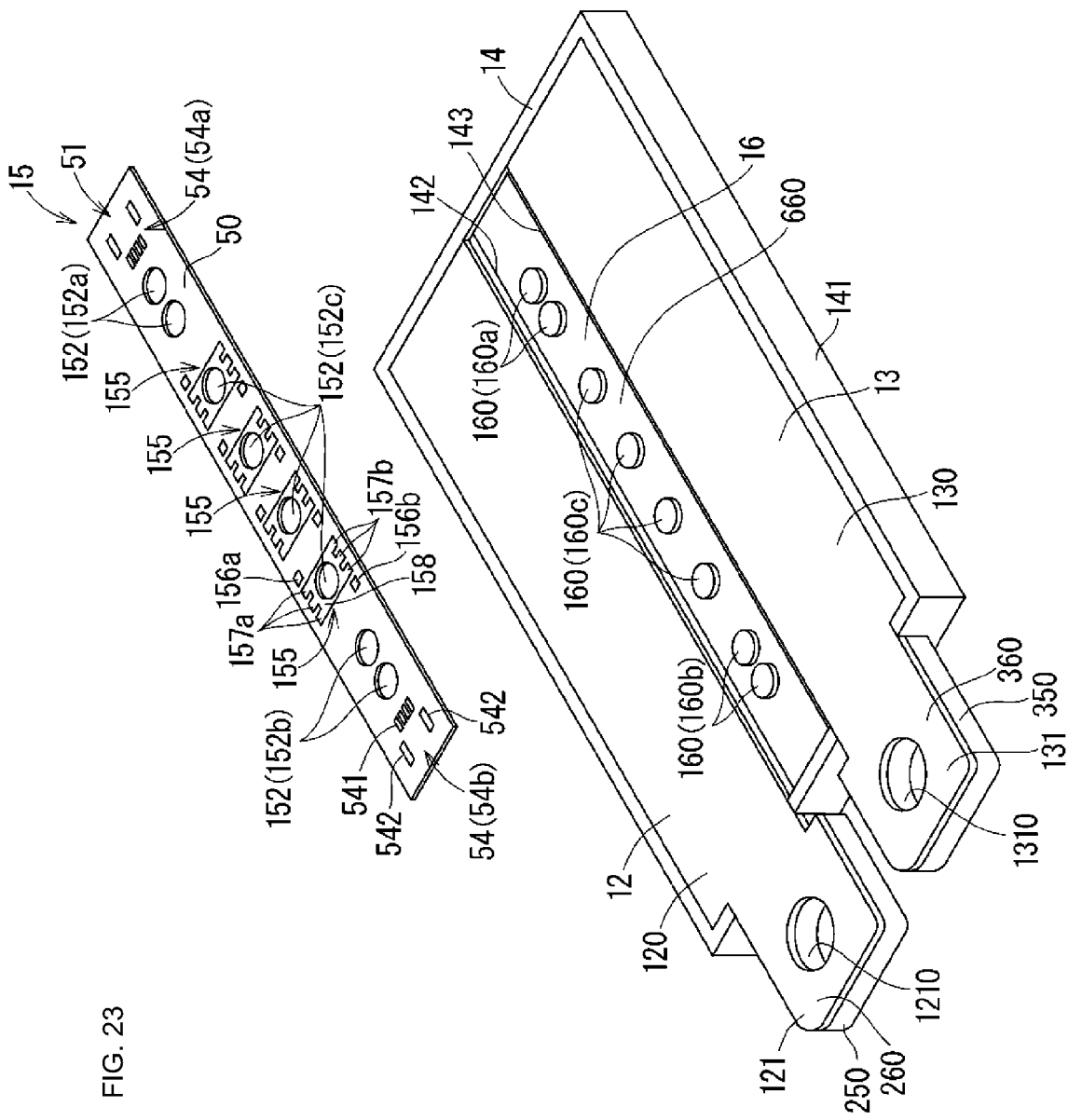
FIG. 23 is a schematic perspective view showing an example of the configuration of part of the circuit structure.

FIG. 23 is a schematic perspective view showing an example of an integrally molded article in which the busbars 12, 13 and 16 and the insulating member 14 are molded as one piece and the wiring board 15. In FIG. 23, the wiring board 15 to be mounted on the busbar 16 is shown separated from the busbar 16.

As shown in FIGS. 17, 23 and other diagrams, the insulating member 14 includes a frame-shaped insulating portion 141, for example. The frame-shaped insulating portion 141 surrounds the main body part 120, the main body part 130 and the busbar 16 therebetween. The insulating member 14 includes an insulating portion 142 located between the busbars 12 and 16 and an insulating portion 143 located between the busbars 13 and 16, in addition to the insulating portion 141. The busbars 12 and 16 are electrically insulated by the insulating portion 142. The busbars 13 and 16 are electrically insulated by the insulating portion 143.

The wiring board 15 is modified in shape from the wiring board 5 of the circuit structure 1A. The wiring board 15 is provided on the busbar 16. The wiring board 15 includes an insulating board 50 and a conductive layer 51 provided on the insulating board 50, for example, similarly to the wiring board 5.

Two connectors 8 are provided on the wiring board 5. The two connectors 8 include a connector 8a to which the gate terminals 61 of the plurality of MOSFETs 6a are electrically connected through the conductive layer 51 of the wiring board 5, and a connector 8b to which the gate terminals 61 of the plurality of MOSFETs 6b are electrically connected through the conductive layer 51. Switching control of the MOSFETs 6a is performed externally through the connector 8a. Switching control of the MOSFETs 6b is performed externally through the connector 8b.

In the present example, one MOSFETs 6a and one MOSFETs 6b are disposed so as to oppose each other. The MOSFETs 6a and MOSFETs 6b disposed opposing each other constitute FET pairs. The circuit structure 1B includes four FET pairs. The four conductive pieces 9 are respectively provided in correspondence with the four FET pairs. The conductive pieces 9 are each provided in order to reduce electrical resistance between the source terminals 62 of the MOSFETs 6a and 6b constituting the FET pair corresponding thereto and the busbar 16.

Detailed Description of Circuit Structure
Example Configuration of Busbar

The busbars 12 and 13 are both constituted by a cladding material, for example. The busbar 12 includes a lower metal layer 250 and an upper metal layer 260, similarly to the busbar 2. The busbar 13 includes a lower metal layer 350 and an upper metal layer 360, similarly to the busbar 3. In the present example, the thickness of the metal layer 250 is similarly set to be greater than the thickness of the metal layer 260, for example. The thickness of the metal layer 250 may, for example, be set to 3 mm, and the thickness of the metal layer 260 may, for example, be set to 2 mm. Also, the thickness of the metal layer 350 is similarly set to be greater than the thickness of the metal layer 360, for example. The thickness of the metal layer 350 may, for example, be set to 3 mm, and the thickness of the metal layer 360 may, for example, be set to 2 mm.

The busbar 16 is constituted by a cladding material, for example, similarly to the busbars 12 and 13. In the present example, the busbar 16 is constituted by two layers, for example. As shown in FIGS. 19 to 22, the busbar 16 includes a metal layer 650 on the lower surface side (also referred to as lower metal layer 650) and a metal layer 660 on the upper surface side (also referred to as upper metal layer 660). The metal layers 650 and 660 are bonded to each other by a method such as assembly rolling, cast rolling, explosive crimping, overlay welding or diffusion welding, for example. The interface between the metal layer 650 and the metal layer 660 is formed by diffusion bonding, for example.

The busbar 16 is constituted by a copper and aluminum cladding material, for example. In the present example, the lower metal layer 650 is an aluminum layer, for example, and the upper metal layer 660 is a copper layer, for example. The lower metal layer 650 is constituted by pure aluminum, for example. Pure aluminum A1050 specified in JIS, for example, is employed as this pure aluminum. The upper metal layer 660 is constituted by oxygen-free copper, for example. Oxygen-free copper C1020 specified in JIS, for example, is employed as this oxygen-free copper.

The linear expansion coefficient of the metal layer 650 is closer to the linear expansion coefficient of the insulating member 14 than is the linear expansion coefficient of the metal layer 660, for example. In the present example, the linear expansion coefficient of the metal layer 650 constituted by pure aluminum is 24 ppm/° C., for example. The linear expansion coefficient of the metal layer 660 constituted by oxygen-free copper is 17 ppm/° C., for example.

The upper surface of the busbar 16 is, throughout its entirety, slightly lower than the upper surface of the busbars 12 and 13. The upper surface of the busbar 16 is lower than the upper surface of the busbars 12 and 13 by the thickness of the wiring board 15, for example. The outer shape of the upper surface of the busbar 16 is substantially the same as the outer shape of the wiring board 15.

A plurality of conductive raised parts 160 are provided on the upper surface of the busbar 16. The plurality of raised parts 160 are constituted by part of the busbar 16, for example. Specifically, the plurality of raised parts 160 are constituted by part of the upper metal layer 660, for example. In the present example, the raised parts 160 are part of the upper metal layer 660, and are thus constituted by copper, for example.

The plurality of raised parts 160 are aligned in a row in the long direction of the busbar 16. The raised parts 160 are disc-shaped, for example. When the wiring board 15 is placed on the busbar 16, the plurality of raised parts 160 are respectively inserted into a plurality of open holes 152, described later, provided in the wiring board 15.

The plurality of raised parts 160 include four raised parts 160c respectively corresponding to the four FET pairs. The plurality of raised parts 160 include two raised parts 160a corresponding to the Zener diode 7a. The plurality of raised parts 160 include two raised parts 160b corresponding to the Zener diode 7b. The two raised parts 160a are provided at one end of a row formed by the plurality of raised parts 160, the two raised parts 160b are provided at the other end of the row, and the four raised parts 160c are located between the two raised parts 160a and the two raised parts 160b.

The thickness of the metal layer 650 is set to be greater than the thickness of the metal layer 660, for example. The thickness of the metal layer 650 may, for example, be set to 3 mm, and the thickness of the portion of the metal layer 660 where the raised parts 160 are present may, for example, be set to 2 mm. The conductivity of the metal layer 660 is greater than the conductivity of the metal layer 650.

Example Configuration of Wiring Board

As shown in FIG. 23 and other diagrams, the wiring board 15 includes the plurality of open holes 152 that pass through in the thickness direction thereof. The plurality of open holes 152 are aligned in a row in the long direction of the wiring board 15. The plurality of open holes 152 includes a plurality of open holes 152c respectively corresponding to the four FET pairs. Also, the plurality of open holes 152 includes two open holes 152a corresponding to the Zener diode 7a and two open holes 152b corresponding to the Zener diode 7b. The two open holes 152a are located at one end of a row constituted by the plurality of open holes 152, and the two open holes 152b are located at the other end of the row. The four open holes 152c are located between the two open holes 152a and the two open holes 152b.

The FET pairs are disposed close to the open holes 152c corresponding thereto. The Zener diode 7a is disposed close to the two open holes 152a. The Zener diode 7b is disposed close to the two open holes 152b.

The conductive layer 51 of the wiring board 15 includes four conductive regions 155 respectively corresponding to the four FET pairs. Also, the conductive layer 51 of the wiring board 15 includes two of the above-described conductive regions 54 respectively corresponding to the connectors 8a and 8b. Hereafter, the conductive region 54 corresponding to the connector 8a may be referred to as conductive region 54a, and the conductive region 54 corresponding to the connector 8b may be referred to as conductive region 54b. Note that, in FIGS. 19 to 21, illustration of the conductive layer 51 is omitted.

The conductive regions 155 have lands 156a and 156b to which the gate terminals 61 of the MOSFETs 6a and 6b constituting the FET pairs corresponding thereto are respectively bonded. Also, the conductive regions 155 include a plurality of lands 157a to which the plurality of source terminals 62 of the MOSFETs 6a in the FET pairs corresponding thereto are respectively bonded. Also, the conductive regions 155 include a plurality of lands 157b to which the plurality of source terminals 62 of the MOSFETs 6b in the FET pairs corresponding thereto are respectively bonded. Also, the conductive regions 155 include an extension region 158 extending from the plurality of lands 157a and the plurality of lands 157b. The plurality of lands 157a and the plurality of lands 157b can also be said to be connected by the extension region 158.

The extension region 158 included in the conductive region 155 corresponding to each FET pair is located around the open hole 152c corresponding to the FET pair. The extension region 158 is provided so as to surround the open hole 152c. The open hole 152c can also be said to be provided in the extension region 158. The lands 157a and 157b can also be said to be protruding parts protruding from the extension region 158.

In the present example, the open holes 152c are through holes in which a conductive region is formed on the inner circumferential surface thereof, for example. On the other hand, the open holes 152a and 152b do not have a conductive region formed on the inner circumferential surface thereof and are not through holes, for example. The conductive region on the inner circumferential surface of the open holes 152c is constituted by a metal, for example. The conductive region on the inner circumferential surface of the open holes 152c may be constituted by the same material as the conductive layer 51 or may be constituted by a different material. The conductive region on the inner circumferential surface of each open hole 152c is joined to the extension region 158 around the open hole 152c. Note that a conductive region may not be formed on the inner circumferential surface of the open holes 152c. Also, the open holes 152a and 152b may be through holes in which a conductive region is formed on the inner circumferential surface thereof.

The conductive regions 54a and 54b are located on the outer side of the plurality of open holes 152. The conductive regions 54a and 54b are respectively located at either edge portion of the wiring board 15 in the long direction thereof. The two lands 542 included in the conductive region 54a are respectively bonded by solder, for example, to two metal regions for use in fixing the connector 8a that are provided on the back surface of the connector 8a. The four lands 541 included in the conductive region 54a are respectively bonded by solder, for example, to the four connection terminals 81 included in the connector 8a. The two lands 542 included in the conductive region 54b are respectively bonded by solder, for example, to two metal regions for use in fixing the connector 8a that are provided on the back surface of the connector 8b. The four lands 541 included in the conductive region 54b are respectively bonded by solder, for example, to the four connection terminals 81 included in the connector 8b.

The conductive layer 51 of the wiring board 15 also includes a wiring region. The wiring region includes a plurality of first wirings respectively electrically connected to the gate terminals 61 of the plurality of MOSFETs 6a. The plurality of first wirings are respectively joined at one end to the plurality of lands 156a to which the gate terminals 61 of the plurality of MOSFETs 6a are bonded. The plurality of first wirings are respectively joined at the other end to the plurality of lands 541 to which the plurality of connection terminals 81 of the connector 8a are bonded. The gate terminals 61 of the MOSFETs 6a are electrically connected to the connection terminals 81 of the connector 8a through the first wirings. Also, the wiring region includes a plurality of second wirings respectively electrically connected to the gate terminals 61 of the plurality of MOSFETs 6b. The plurality of second wires are respectively joined at one end to the plurality of lands 156b. The plurality of second wirings are joined at the other end to the plurality of lands 541 to which the plurality of connection terminals 81 of the connector 8b are bonded. The gate terminals 61 of the MOSFETs 6b are electrically connected to the connection terminals 81 of the connector 8b through the second wirings.

Figure 24:
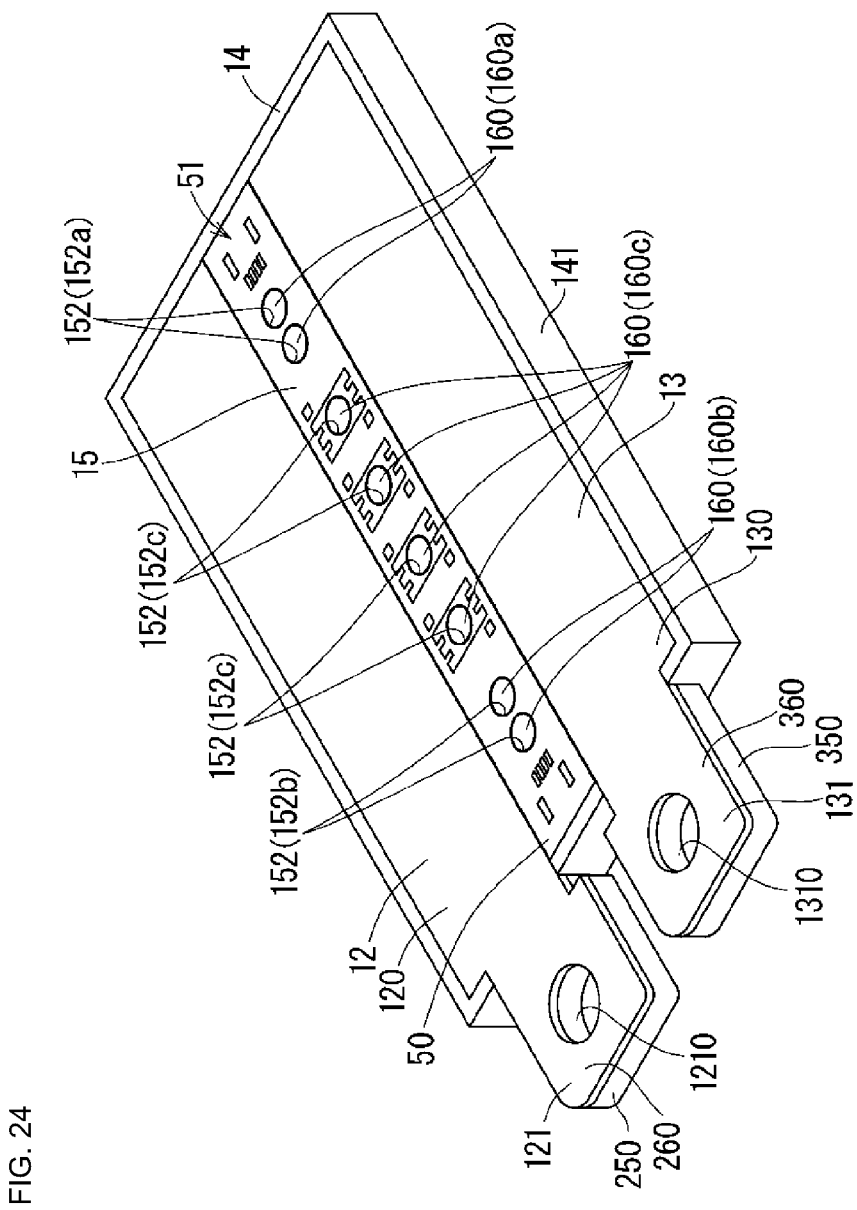
FIG. 24 is a schematic perspective view showing an example of the configuration of part of the circuit structure.

The wiring board 15 having a configuration such as the above is mounted on the upper surface of the busbar 16. FIG. 24 is a diagram showing an example in which the wiring board 15 is mounted on the busbar 16.

When the wiring board 15 is mounted on the busbar 16, the plurality of raised parts 160c are respectively inserted into the plurality of open holes 152c, the plurality of raised parts 160a are respectively inserted into the plurality of open holes 152a, and the plurality of raised parts 160b are respectively inserted into the plurality of open holes 152b. The diameter of the raised parts 160 is set slightly smaller than the diameter of the open holes 152.

The wiring board 15 is located not only on the busbar 16 but also on the insulating portion 142 located between the busbars 12 and 16 and on the insulating portion 143 located between the busbars 13 and 16. The wiring board 15 is adjacent to the main body part 120 of the busbar 12 and the main body part 130 of the busbar 13. The upper end faces of the insulating portions 142 and 143 are flush with the upper surface of the lower metal layers 250, 350 and 650, for example, as shown in FIGS. 19 to 21. The upper surface of the insulating board 50 of the wiring board 15 on the busbar 16 is flush with the upper surface of the busbars 12 and 13. Note that the upper surface of the conductive layer 51 on the insulating board 50 may be located in the same plane as the upper surfaces of the busbars 12 and 13.

The wiring board 15 is fixed to the busbar 16 by a bonding material, for example. Double-sided adhesive tape, for example, is employed as the bonding material. Other members may also be employed as the bonding material. Also, the wiring board 15 may be simply placed on the busbar 16 and not fixed.

The upper surfaces of the raised parts 160 in the open holes 152 are located in the same plane as the upper surface of the conductive layer 51 on the insulating board 50 of the wiring board 15, for example. In this case, the upper surface of the raised part 160c in each open hole 152c will be flush with the upper surface of the extension region 158 around the open hole 152c. Note that the upper surfaces of the raised parts 160 may be located in the same plane as the upper surface of the insulating board 50 of the wiring board 15.

Regarding Conductive Pieces

The plurality of conductive pieces 9 are respectively bonded to the plurality of raised parts 160c exposed from the upper surface of the wiring board 15. Also, the plurality of conductive pieces 9 are respectively bonded to the plurality of extension regions 158 of the wiring board 15. Each conductive piece 9 is provided on the wiring board 15 so as to cover the upper surface of the raised part 160c in the open hole 152*c* in the wiring board 15 and a peripheral portion of the open hole 152*c*. The conductive piece 9 covers the opening edge of the open hole 152*c* (specifically, the opening edge on the upper surface side of the wiring board 15). Each conductive piece 9 is bonded by the above-described conductive bonding material 115 to the upper surface of the raised part 160*c* in the open hole 152*c* and the extension region 158 around the open hole 152*c* (see FIG. 20). The conductive bonding material 115 includes a portion located between the conductive piece 9 and the raised part 160*c* and extension region 158.

Note that the conductive bonding material 115 may enter the open holes 152*c*. In this case, the conductive region on the inner circumferential surface of each open hole 152*c* which is a through hole and the raised part 160*c* in the open hole 152*c* may be bonded by the conductive bonding material 115.

Example Implementation of Electronic Components

The MOSFETs 6*a* are mounted to straddle between both the busbar 12 and the wiring board 15 that is on the busbar 16. As shown in FIGS. 19 and 20, the insulating portion 142 is located between the busbar 12 and the busbar 16. The MOSFETs 6*a* are provided on the busbars 12 and 16 so as to straddle the insulating portion 142.

The MOSFETs 6*b* are mounted to straddle between both the busbar 13 and the wiring board 15 that is on the busbar 16. As shown in FIGS. 19 and 20, the insulating portion 143 is located between the busbar 13 and the busbar 16. The MOSFETs 6*b* are provided on the busbars 13 and 16 so as to straddle the insulating portion 143.

The drain terminals 63 of the MOSFETs 6*a* are bonded by the conductive bonding material 103 to the upper surface of the busbar 12, similarly to as described above. The voltage applied to the input terminal part 121 of the busbar 12 is applied to the drain terminals 63 of the MOSFETs 6*a* bonded to the busbar 12.

The drain terminals 63 of the MOSFETs 6*b* are bonded to the upper surface of the busbar 13 by the conductive bonding material 103, similarly to as described above. The output voltage of the drain terminals 63 of the MOSFETs 6*b* is output externally from the output terminal part 131 of the busbar 13.

The gate terminals 61 of the MOSFETs 6*a* and 6*b* constituting each FET pair are respectively bonded by the conductive bonding material 101, similarly to as described above, to the lands 156*a* and 156*b* included in the conductive region 155 corresponding to the FET pair. The gate terminal 61 of the MOSFET 6*a* is electrically connected to the connection terminal 81 of the connector 8*a* through the land 156*a*, the wiring region included in the conductive layer 51 and the land 541. The gate terminal 61 of the MOSFET 6*b* is electrically connected to the connection terminal 81 of the connector 8*b* through the land 156*b*, the wiring region included in the conductive layer 51 and the land 541. Switching control of each MOSFET 6*a* is performed externally through the connector 8*a*. Switching control of each MOSFET 6*b* is performed externally through the connector 8*b*.

The plurality of source terminals 62 of the MOSFET 6*a* of each FET pair are respectively bonded by the conductive bonding material 102, similarly to as described above, to the plurality of lands 157*a* included in the conductive region 155 corresponding to the FET pair. The plurality of source terminals 62 of the MOSFET 6*b* of each FET pair are respectively bonded by the conductive bonding material 102 to the plurality of lands 157*b* included in the conductive region 155 corresponding to the FET pair. The source terminals 62 of the MOSFET 6*a* are electrically connected to the output-side busbar 13 through the lands 157*a*, the extension region 158 joined to the lands 157*a*, the conductive piece 9 bonded to the extension region 158, and the conductive raised part 160*c* to which the conductive piece 9 is bonded. Also, the source terminals 62 of the MOSFET 6*b* are electrically connected to the output-side busbar 13 through the lands 157*b*, the extension region 158 joined to the lands 157*b*, the conductive piece 9 bonded to the extension region 158, and the conductive raised part 160*c* to which the conductive piece 9 is bonded. The conductive piece 9 functions as a relay terminal that electrically connects the source terminals 62 and the raised part 160*c*.

The Zener diode 7*a* is mounted to straddle between both the busbar 12 and the wiring board 15 that is on the busbar 16, similarly to the MOSFETs 6*a*. The insulating portion 142 is located between the busbar 12 and the busbar 16. As shown in FIG. 21, the Zener diode 7*a* is provided on the busbars 12 and 16 so as to straddle the insulating portion 142.

The Zener diode 7*b* is mounted to straddle between both the busbar 13 and the wiring board 15 that is on the busbar 16, similarly to the MOSFETs 6*b*. The insulating portion 143 is located between the busbar 13 and the busbar 16. The Zener diode 7*b* is provided on the busbars 13 and 16 so as to straddle the insulating portion 143.

The cathode terminal 71 of the Zener diode 7*a* is bonded to the upper surface of the busbar 12 by the conductive bonding material 111, similarly to as described above. The cathode terminal 71 of the Zener diode 7*a* is electrically connected to the drain terminals 63 of the MOSFETs 6*a* through the busbar 12.

The cathode terminal 71 of the Zener diode 7*b* is bonded to the upper surface of the busbar 13 by the conductive bonding material 111, similarly to as described above. The cathode terminal 71 of the Zener diode 7*b* is electrically connected to the drain terminals 63 of the MOSFETs 6*b* through the busbar 13.

The anode terminal 72 of the Zener diode 7*a* is bonded, similarly to as described above, to the raised part 160*a* in one of the two open holes 152*a* provided in the wiring board 15. The anode terminal 73 of the Zener diode 7*a* is bonded by the conductive bonding material 112, similarly to as described above, to the raised part 160*a* in the other of the two open holes 152*a*. The anode terminal 72 of the Zener diode 7*a* is electrically connected to the source terminals 62 of the MOSFETs 6*a* through the raised part 160*a* and the busbar 16.

The anode terminal 72 of the Zener diode 7*b* is bonded, similarly to as described above, to the raised part 160*b* in one of the two open holes 152*b* provided in the wiring board 15. The anode terminal 73 of the Zener diode 7*b* is bonded by the conductive bonding material 112, similarly to as described above, to the raised part 160*b* in the other of the two open holes 152*b*. The anode terminals 72 and 73 of the Zener diode 7*b* is electrically connected to the source terminals 62 of the MOSFETs 6*b* through the raised part 160*b* and the busbar 16.

In the present example, given that the raised parts 160*a* and 160*b* are constituted by part of the busbar 16, the anode terminals 72 and 73 can also be said to be bonded to the upper surface of the busbar 16.

Example of Manufacturing Method for Circuit Structure

In the case of manufacturing the circuit structure 1B having a configuration such as the above, first, three pieces of the above-described cladding material 10 (see FIG. 10) for producing the busbars 12, 13 and 16 are prepared.

Figure 25:
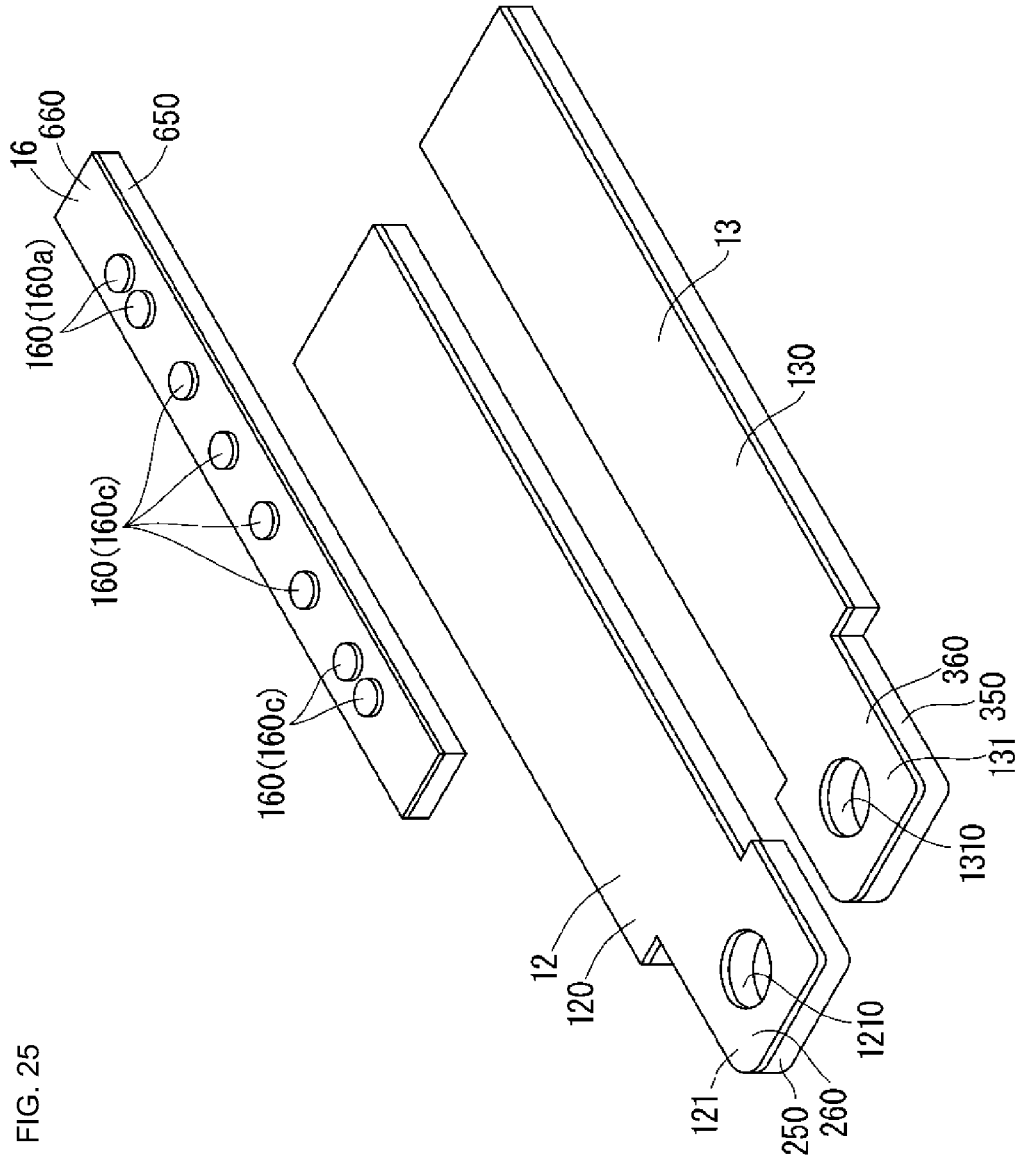
FIG. 25 is a schematic perspective view for describing an example of a manufacturing method of the circuit structure.

Next, cold forging, cutting or the like is performed on the three pieces of cladding material 10 to produce the busbars 12, 13 and 16, as shown in FIG. 25.

Next, the busbars 12, 13 and 16 are disposed in a mold for insert molding. A thermoplastic resin having excellent heat resistance such as PPS is then injected into the mold for insert molding from an injection molding machine, and the busbars 12, 13 and 16 and the resin are molded as one piece. An integrally molded article in which the busbars 12, 13 and 16 and the insulating member 14 are molded as one piece is thereby obtained.

Next, the wiring board 15 is fixed to the upper surface of the busbar 16 included in the produced integrally molded article by a bonding material such as double-sided adhesive tape. The structure shown in FIG. 24 described above is thereby obtained.

Figure 26:
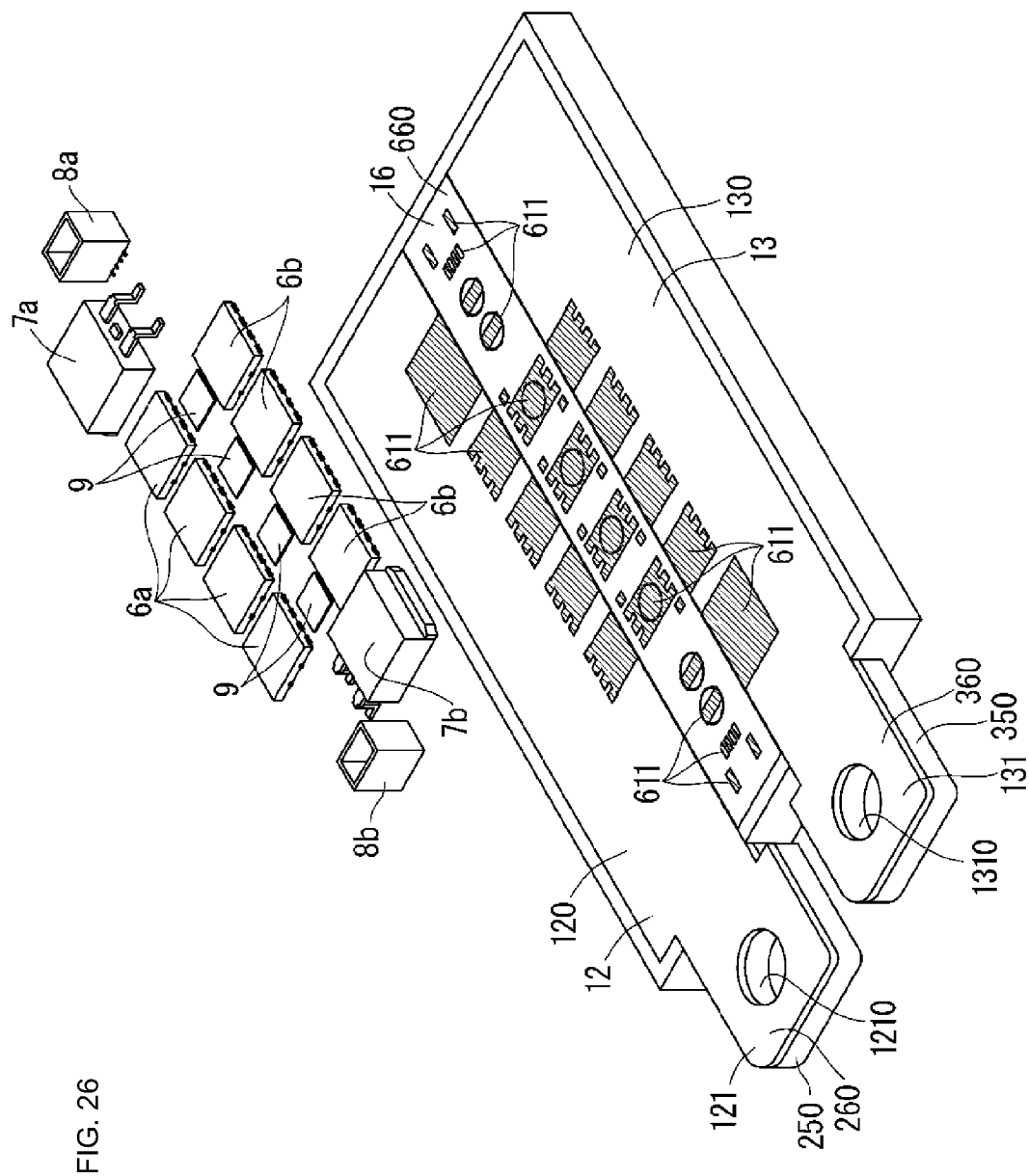
FIG. 26 is a schematic perspective view for describing an example of the manufacturing method of the circuit structure.

Next, as shown in FIG. 26, a solder paste 611 is applied to predetermined regions of the upper surfaces of the busbar 12, the busbar 13, the busbar 16 and the wiring board 15. In FIG. 26, the solder paste 611 is shaded. The plurality of MOSFETs 6, the plurality of Zener diodes 7, the plurality of connectors 8 and the plurality of conductive pieces 9 are then soldered with a reflow method to the regions to which the solder paste 611 was applied. The above-described circuit structure 1B shown in FIGS. 17, 18 and other diagrams is thereby completed.

Figure 27:
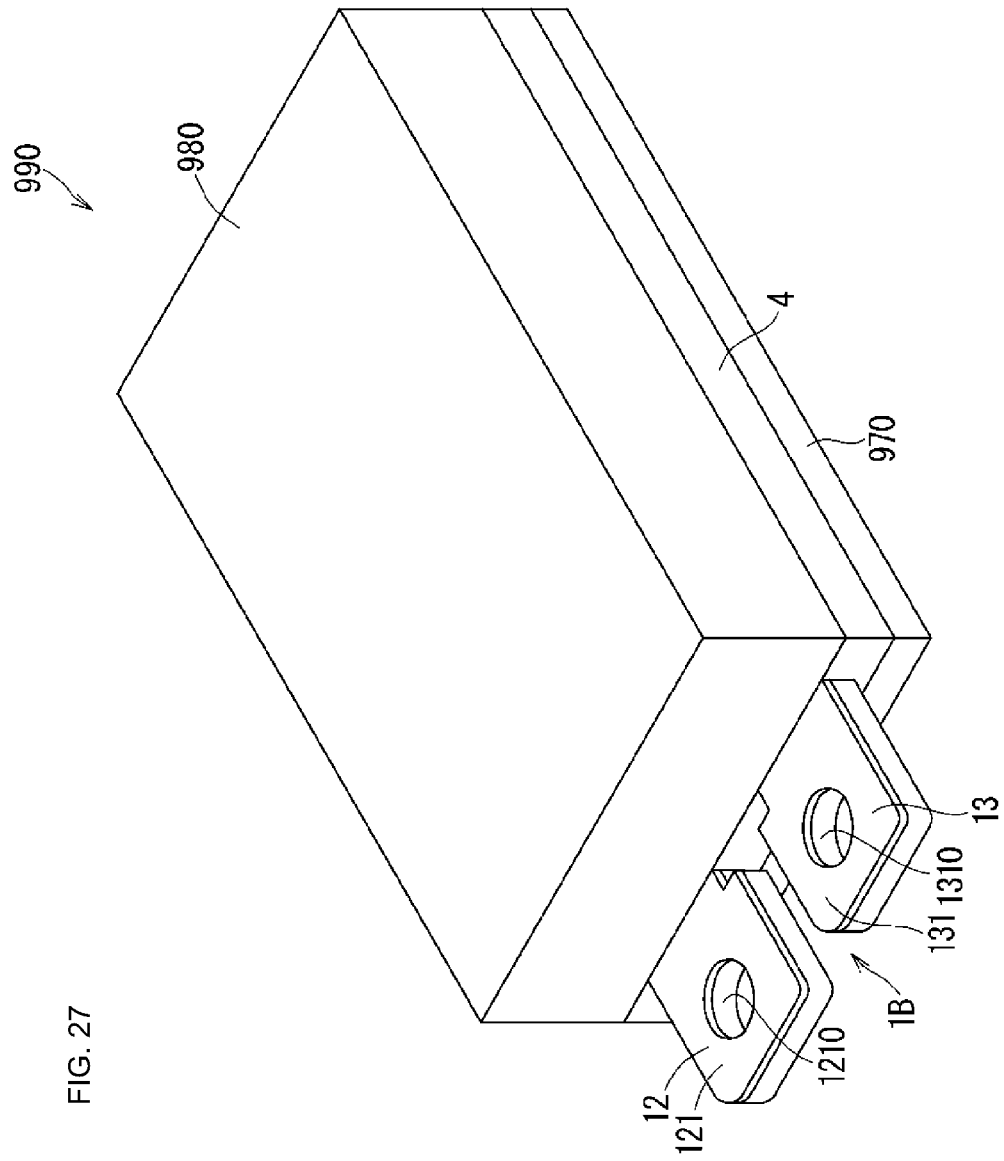
FIG. 27 is a schematic perspective view showing an example of an electrical junction box.

Thereafter, as shown in FIG. 27, a heat sink 970 is attached to the back surfaces of the busbars 12, 13 and 16 via a heat conductive member such as a heat dissipation sheet. A case 980 covering the wiring board 15, the plurality of MOSFETs 6, the plurality of Zener diodes 7, the plurality of connectors 8 and the plurality of conductive pieces 9 is then attached to the busbars 12 and 13. An electrical junction box 990 is thereby completed.

As described above, in the present example, given that the busbars 12 and 13 are constituted by a cladding material, the linear expansion coefficient of the busbars 12 and 13 as a whole can be approximated to the linear expansion coefficient of the insulating member 14, together with bonding of the drain terminals 63 to the busbars 12 and 13 being facilitated. Thermal stress is thereby less likely to occur in the bonding portion of the drain terminals 63 and the busbars 12 and 13, together with bonding of the drain terminals 63 to the busbars 12 and 13 being facilitated. As a result, the reliability of the bonding portion improves. Also, since heat generated by the MOSFETs 6 can be transferred directly to the busbars 12 and 13, local increases in temperature are less likely to occur. Similarly, thermal stress is less likely to occur in the bonding portion of the cathode terminals 71 and the busbars 12 and 13, together with bonding of the cathode terminals 71 to the busbars 12 and 13 being facilitated. As a result, the reliability of the bonding portion improves.

Also, in the present example, given that the busbar 16 is constituted by a cladding material, the linear expansion coefficient of the busbar 16 as a whole can be approximated to the linear expansion coefficient of the insulating member 14, together with bonding of the anode terminals 72 and 73 of the Zener diodes 7 to the busbar 16 (specifically, the raised parts 160a and 160b) being facilitated. Thermal stress is thereby less likely to occur in the bonding portion of the anode terminals 72 and 73 and the busbar 16, together with bonding of the anode terminals 72 and 73 to the busbar 16 being facilitated. As a result, the reliability of the bonding portion improves.

Also, in the present example, the busbars 12, 13 and 16 made of a cladding material can be easily produced by laminating a plurality of metal layers, similarly to the busbars 2 and 3 described above. Also, in the case where the metal layer that is used as the metal layer 260 bonds more easily to the drain terminals 63 and the cathode terminal 71 than the metal layer 250, the linear expansion coefficient of the busbar 12 as a whole can be approximated to the linear expansion coefficient of the insulating member 14, while at the same time facilitating bonding of the drain terminals 63 and the cathode terminal 71 to the metal layer 260. Also, in the case where the metal layer that is used as the metal layer 360 bonds more easily to the drain terminals 63 and the cathode terminal 71 than the metal layer 350, the linear expansion coefficient of the busbar 13 as a whole can be approximated to the linear expansion coefficient of the insulating member 14, while at the same time facilitating bonding of the drain terminals 63 and the cathode terminal 71 to the metal layer 360.

Also, in the present example, the busbars 12, 13 and 16 made of a cladding material can be easily produced using aluminum and copper, similarly to the busbars 2 and 3. Also, copper bonds more easily to the drain terminals 63 and the cathode terminals 71 than aluminum, whereas aluminum has a linear expansion coefficient closer to the insulating member 14 than copper. Accordingly, the linear expansion coefficient of the busbar 12 as a whole can be approximated to the linear expansion coefficient of the insulating member 14, while at the same time facilitating bonding of the drain terminals 63 and the cathode terminal 71 to the metal layer 260. Also, the linear expansion coefficient of the busbar 13 as a whole can be approximated to the linear expansion coefficient of the insulating member 14, while at the same time facilitating bonding of the drain terminals 63 and the cathode terminal 71 to the metal layer 360.

Also, in the busbar 12 according to the present example, given that the linear expansion coefficient of the metal layer 250 is closer to the linear expansion coefficient of the insulating member 14 than is the linear expansion coefficient of the metal layer 260, a metal layer having a linear expansion coefficient close to the linear expansion coefficient of the insulating member 14 can be employed as the metal layer 250, without considering bondability to the drain terminals 63 and the cathode terminal 71. Similarly, a metal layer having a linear expansion coefficient close to the linear expansion coefficient of the insulating member 14 can be employed as the metal layer 350, without considering bondability to the drain terminals 63 and the cathode terminal 71.

Also, in the present example, the upper end face of the insulating portion 142 of the insulating member 14 is flush with the upper surface of the lower metal layer 250 having a linear expansion coefficient close to the linear expansion coefficient of the insulating member 14 (e.g., see FIG. 19). The upper metal layer 260 of the busbar 12 is thereby less likely to be affected by deformation of the insulating portion 142 caused by changes in ambient temperature. As a result, thermal stress is less likely to occur in the bonding portion of the upper metal layer 260 of the busbar 12 and the drain terminals 63 and cathode terminal 71. Accordingly, a metal layer having a large difference in linear expansion coefficient from the insulating member 14 can be used as the metal layer 260.

Also, in the present example, the upper end face of the insulating portion 143 of the insulating member 14 is flush with the upper surface of the lower metal layer 350 having a linear expansion coefficient close to the linear expansion coefficient of the insulating member 14 (e.g., see FIG. 19). The upper metal layer 360 of the busbar 13 is thereby less likely to be affected by deformation of the insulating portion 143 caused by changes in ambient temperature. As a result, thermal stress is less likely to occur in the bonding portion of the upper metal layer 360 and the anode terminals 72 and 73. Accordingly, a metal layer having a large difference in linear expansion coefficient from the insulating member 14 can be used as the metal layer 360.

Also, in the present example, the upper end faces of the insulating portion 142 and the insulating portion 143 are flush with the upper surface of the lower metal layer 250, the lower metal layer 650 and the lower metal layer 350, and the lower metal layer 250, the lower metal layer 650 and the lower metal layer 350 are constituted by the same type of metal, such as aluminum, for example. The distribution of thermal stress in a direction along the upper surfaces of both the lower metal layer 250 and the lower metal layer 650 thus occurs symmetrically across the insulating member 14 (left-right direction in FIG. 19 to FIG. 21), and the thermal stresses that occur on both sides cancel each other out. Similarly, the distribution of thermal stress in a direction along the upper surfaces of both the lower metal layer 650 and the lower metal layer 350 thus occurs symmetrically across the insulating member 14 (left-right direction in FIG. 19 to FIG. 21), and the thermal stresses that occur on both sides cancel each other out. As a result, thermal stress is less likely to occur in the bonding portions of the upper metal layer 260 and the drain terminals 63 and cathode terminal 71 (e.g., see FIG. 19 to FIG. 21), and the reliability of the bonding portions improves. Similarly, thermal stress is less likely to occur in the bonding portions of the wiring board 15 on the upper metal layer 660 and the gate terminals 61 and source terminals 62 (e.g., see FIGS. 19 and 20), and the reliability of the bonding portions improves. Similarly, thermal stress is less likely to occur in the bonding portions of the upper metal layer 660 and the anode terminals 72 and 73 (e.g., see FIG. 21), and the reliability of the bonding portions improves.

Also, in the present example, given that the busbar 12, the busbar 13, the busbar 16 and the insulating member 14 are molded as one piece, a member for integrating the busbar 12, the busbar 13, the busbar 16 and the insulating member 14 is not required. The configuration of the circuit structure 1B can thus be simplified.

Also, in the present example, the conductive raised parts 160 protrude from the busbar 16 into the open holes 152 of the wiring board 15. By electrically connecting the source terminals 62 on the wiring board 15 to the raised parts 160c in the open holes 152c, the source terminals 62 can thus be easily electrically connected to the busbar 16. Also, by electrically connecting the anode terminals 72 and 73 on the wiring board 15 to the raised parts 160 in the open holes 152, the anode terminals 72 and 73 can be easily electrically connected to the busbar 16.

In the present example, given that the raised parts 160 are constituted by part of the busbar 16, electrical resistance between the source terminals 62 and the busbar 16 can be reduced, and also electrical resistance between the anode terminals 72 and 73 and the busbar 16 can be reduced.

Also, in the present example, given that the anode terminals 72 and 73 are bonded to the raised parts 160, electrical resistance between the anode terminals 72 and 73 and the busbar 16 can be reduced.

Also, in the present example, conductive pieces 9 bonded to the extension regions 158 that extend from the lands 157a to which the source terminals 62 of the MOSFETs 6a are bonded and are located around the open holes 152c and to the upper surfaces of the raised parts 160c in the open holes 152c are provided. Due to such conductive pieces 9, electrical resistance between the source terminals 62 of the MOSFETs 6a and the busbar 16 can be reduced. Also, given that transfer of heat generated by the MOSFETs 6a to the busbar 16 is facilitated by the conductive pieces 9, local increases in temperature are less likely to occur. Similarly, due to the conductive pieces 9, electrical resistance between the source terminals 62 of the MOSFETs 6b and the busbar 16 can be reduced. Also, given that transfer of heat generated by the MOSFETs 6b to the busbar 16 is facilitated by the conductive pieces 9, local increases in temperature are less likely to occur.

Also, in the present example, the extension regions 158 surrounds the open holes 152c, and the conductive pieces 9 cover the opening edges of the open holes 152c. The bonding area of the conductive pieces 9 and the extension regions 158 and raised parts 160c can thereby be increased. As a result, electrical resistance between the source terminals 62 and the busbar 16 can be further reduced.

Also, in the present example, given that the wiring board 15 is located on a lower region than the upper surface of the busbars 12 and 13, on the upper surface of the busbar 16, a difference in level between the wiring board 15 and the busbars 12 and 13 can be suppressed. Therefore, the MOSFETs 6a and Zener diode 7a can be easily provided to straddle between the wiring board 15 and the busbar 12. Also, the MOSFETs 6b and the Zener diode 7b can be easily provided to straddle between the wiring board 15 and the busbar 13. In the present example, the entire area of the upper surface of the busbar 16 is a lower region than the upper surface of the busbars 12 and 13, on the upper surface of the busbar 16.

Also, in the present example, given that the extension regions 158 to which the conductive pieces 9 are bonded extend from both the lands 157a to which the source terminals 62 of the MOSFETs 6a are bonded and the lands 157b to which the source terminals 62 of the MOSFETs 6b are bonded and are located around the open holes 152c, the extension regions 158 can be shared by the MOSFETs 6a and 6b. Electrical resistance between the source terminals 62 and the busbar 16 of the MOSFETs 6a and electrical resistance between the source terminals 62 of the MOSFETs 6b and the busbar 16 can thereby be reduced with a simple configuration.

Note that the linear expansion coefficient of the wiring board 15 is closer to the linear expansion coefficient of the insulating member 14 (e.g., 40 ppm/° C.) than are the linear expansion coefficients of the upper metal layers 260, 360 and 660 (e.g., 17 ppm/° C.). The linear expansion coefficient of the wiring board 15 may, for example, be 18 ppm/° C. or greater. Also, the linear expansion coefficient of the wiring board 15 may be closer to the linear expansion coefficient of the insulating member 14 than are the linear expansion coefficients of the lower metal layers 250, 350 and 650 (e.g., 24 ppm/° C.). The linear expansion coefficient of the wiring board 15 may, for example, be 25 ppm/° C. or greater. Thermal stress is thereby less likely to occur in the bonding portion of the wiring board 15 and the source terminals 62. As a result, the reliability of the bonding portion improves.

Also, the connection terminal of the wiring member extending from the battery may be brought in contact with the upper metal layer 260 of the input terminal part 121 of the busbar 12. Since the conductivity of the upper metal layer 260 is greater than the conductivity of the lower metal layer 250, electrical resistance between the input terminal part 121 and the battery can be reduced. Also, the connection terminal of the wiring member extending from an electrical component may be brought in contact with the upper metal layer 360 of the output terminal part 131 of the busbar 13.

Since the conductivity of the upper metal layer 360 is greater than the conductivity of the lower metal layer 350, electrical resistance between the output terminal part 131 and the electrical component can be reduced.

Other Examples of Circuit Structure

The structures of the circuit structures 1A and 1B are not limited to the above examples. At least one of the busbars 2, 3, 12, 13 and 16 may, for example, be constituted by a cladding material consisting of three or more metal layers. In this case, the uppermost metal layer may be constituted by a material to which the connection terminals of electronic components are easily bonded by solder or the like. The uppermost metal layer may, for example, be a copper layer.

Also, at least one of the busbars 2, 3, 12, 13 and 16 may be constituted by a cladding material in which the end face of a metal layer and the end face of a metal layer are bonded. A cladding material in which, for example, the end face of an aluminum layer and the end face of a copper layer are diffusion bonded, rather than an aluminum layer and a copper layer being laminated, may be employed for at least one of the busbars 2, 3, 12, 13 and 16. In this case, the connection terminals of electronic components such as the MOSFETs 6 may be bonded to the copper layer. Also, a cladding material in which three or more metal layers are arranged in one direction in the same plane and the end faces of two adjacent metal layers are bonded together may be employed for at least one of the busbars 2, 3, 12, 13 and 16.

The raised parts 302 may be constituted separately from the busbar 3, rather than being constituted by part of the busbar 3. In this case, the raised parts 302 may be bonded to the upper surface of the busbar 3 by a conductive bonding material such as solder. Similarly, the raised parts 160 may be constituted separately from the busbar 16, rather than being constituted by part of the busbar 16. In this case, the raised parts 160 may be bonded to the upper surface of the busbar 16 by a conductive bonding material such as solder.

Also, the circuit structure 1A may not include the wiring board 5. In this case, another busbar electrically insulated from the busbars 2 and 3 by the insulating member 4 may be provided, for example. The source terminals 62 of the MOSFETs 6 may be bonded to the busbar 3, and the gate terminals 61 of the MOSFETs 6 may be bonded to the other busbar.

Similarly, the circuit structure 1B may not include the wiring board 15. In this case, another busbar electrically insulated from the busbars 12, 13 and 16 by the insulating member 14 may be provided, for example. The source terminals 62 of the MOSFETs 6 may be bonded to the busbar 16, and the gate terminals 61 of the MOSFETs 6 may be bonded to the other busbar.

Also, the circuit structure 1A may not include the conductive pieces 9. In this case, the raised part 302 in each open hole 52 and the extension region 533 around the open hole 52 may be bonded by solder or the like. Similarly, the circuit structure 1B may not include the conductive pieces 9. In this case, the raised part 160 in each open hole 152 and the extension region 158 around the open hole 152 may be bonded by solder or the like.

Figure 28:
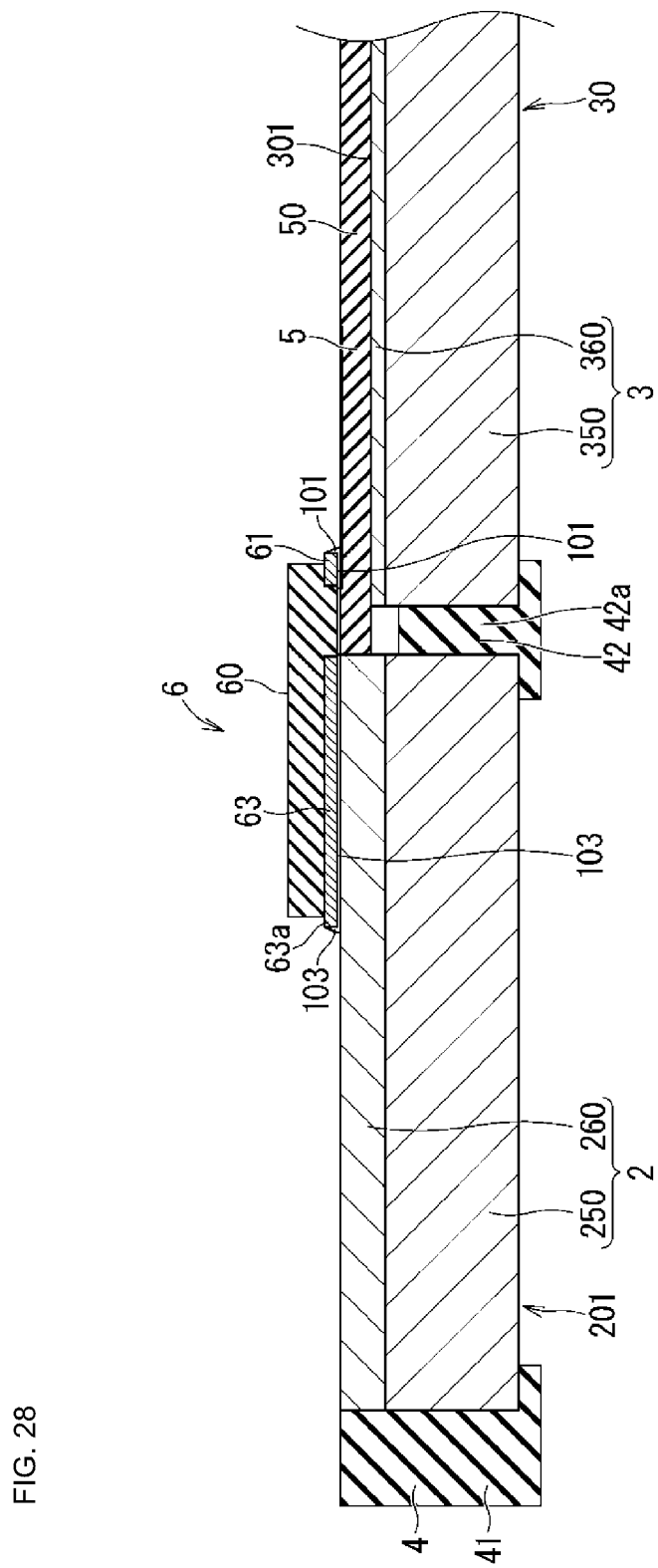
FIG. 28 is a schematic view showing an example of the cross-sectional structure of the circuit structure.

Also, in the circuit structure 1A, the upper end face of the surrounding portion 42a included in the insulating portion 42 may be located lower than the upper surface of the lower metal layers 250 and 350, as shown in FIG. 28. In this case, the upper metal layer 260 is, similarly, less likely to be affected by deformation of the insulating portion 42 caused by changes in ambient temperature. As a result, thermal stress is less likely to occur in the bonding portion of the upper metal layer 260 and the drain terminals 63 and cathode terminal 71.

Figure 29:
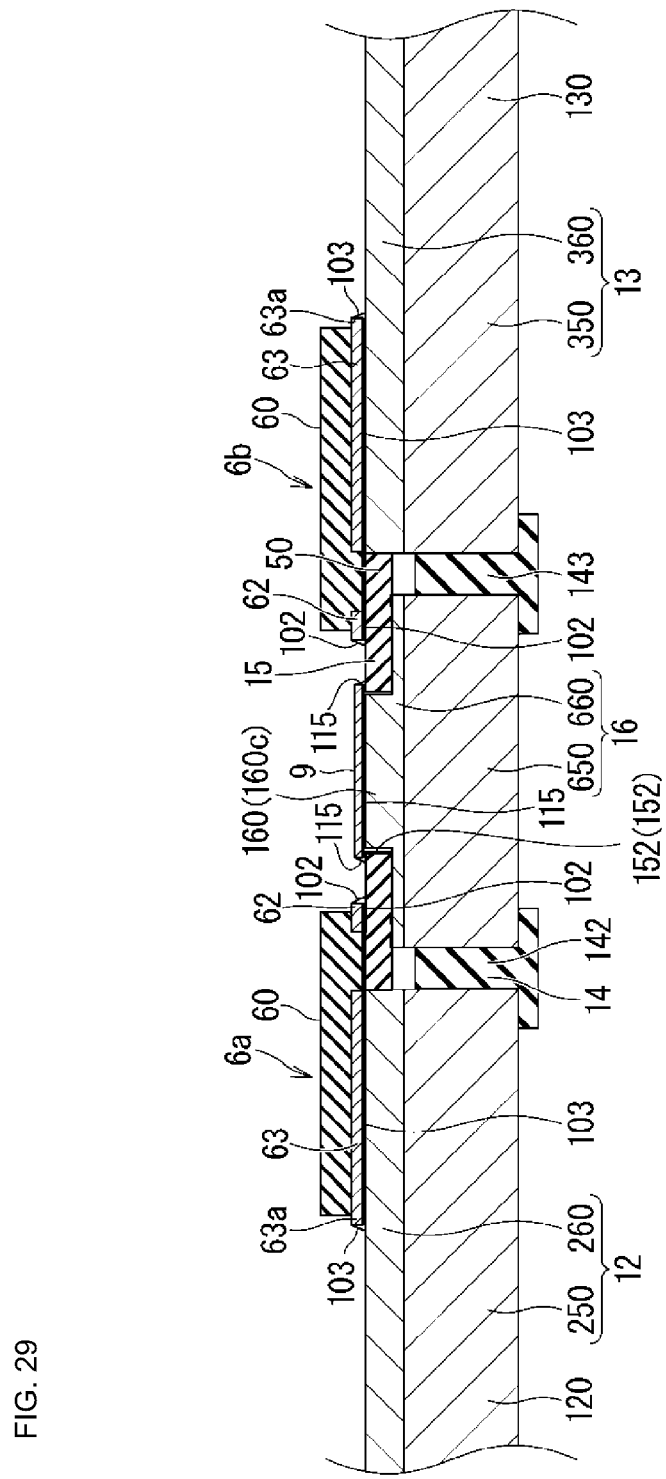
FIG. 29 is a schematic view showing an example of the cross-sectional structure of the circuit structure.

Similarly, in the circuit structure 1B, the upper end face of the insulation portion 142 may be located lower than the upper surface of the lower metal layers 250, 350 and 650, as shown in FIG. 29. Also, the upper end face of the insulating portion 143 may be located lower than the upper surface of the lower metal layers 250, 350 and 650.

Also, in the above example, the main body part 30 of the busbar 3 includes the upper metal layer 360 in a portion other than the raised parts 302, but may not include the upper metal layer 360 in a portion other than the raised parts 302. That is, in the main body part 30, only the plurality of raised parts 302 may be provided on the lower metal layer 350. In this case, the wiring board 5 is fixed on the lower metal layer 350 of the main body part 30. Similarly, in the busbar 16, only the plurality of raised parts 160 may be provided on the lower metal layer 650.

Also, the upper metal layers 260, 360 and 660 may be constituted by a metal material, other than copper, to which the drain terminals 63 and the like are easily bonded by solder or the like. Also, the lower metal layers 250, 350 and 650 may be constituted by a metal material, other than aluminum, that has a linear expansion coefficient close to the linear expansion coefficient of the insulating member 14. Also, the upper metal layers 260, 360 and 660 may have metal plating such as nickel plating on the surface thereof, in order to facilitate solder bonding of terminals or the like to the upper metal layers 260, 360 and 660, to reduce contact resistance between wiring members and the input terminal parts 21 and 121, and to reduce contact resistance between wiring members and the output terminal parts 31 and 131. In this case, the upper metal layers 60, 360 and 660 may be copper layers whose surface has been metal plated.

Also, at least some of the busbars 2, 3, 12, 13 and 16 may be constituted by different cladding materials. Also, at least one of the busbars 2, 3, 12, 13 and 16 may not be a cladding material. For example, at least one of the busbars 2, 3, 12, 13 and 16 may be constituted by only copper or may be constituted by only another type of metal.

Although a circuit structure has been described in detail above, the foregoing description is illustrative in all respects, and the disclosure is not limited thereto. The various variations described above can be applied in combination as long as there are no mutual inconsistencies. Further, it should be understood that numerous variations not illustrated herein can be contemplated without departing from the scope of the disclosure.

The invention claimed is:

1. A circuit structure comprising:
    a first busbar constituted by a cladding material;
    a second busbar;
    an insulating member including an insulating portion located between the first busbar and the second busbar; and
    an electronic component including a main body, the main body is mounted on the first busbar and the second busbar so as to straddle the insulating portion,
    wherein the electronic component has a connection terminal bonded to the first busbar,
    the first busbar includes:
    a first metal layer; and
    a second metal layer laminated on the first metal layer in a thickness direction of the first busbar,
    the connection terminal is bonded to the second metal layer, the first metal layer is an aluminum layer, the second metal layer is a copper layer or a copper layer whose surface has been metal plated, the first metal layer is greater in thickness than the second metal layer, and the first busbar, the second busbar and the insulating member are molded as one piece.

2. The circuit structure according to claim 1, wherein a linear expansion coefficient of the first metal layer is closer to a linear expansion coefficient of the insulating member than is a linear expansion coefficient of the second metal layer.

3. The circuit structure according to claim 2, wherein the second busbar is constituted by a cladding material.

4. The circuit structure according to claim 1, wherein the second busbar is constituted by a cladding material.

5. The circuit structure according to claim 1, wherein an upper end face of the insulating portion is flush with an upper surface of the first metal layer or located lower than the upper surface of the first metal layer.

6. The circuit structure according to claim 1, wherein the second busbar is constituted by a cladding material.

* * * * *